(12) United States Patent
Kawamura

(10) Patent No.: US 7,329,604 B2
(45) Date of Patent: Feb. 12, 2008

(54) SEMICONDUCTOR DEVICE AND METHOD FOR FABRICATING THE SAME

(75) Inventor: Kazuo Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 11/100,501

(22) Filed: Apr. 7, 2005

(65) Prior Publication Data
US 2006/0125022 A1    Jun. 15, 2006

(30) Foreign Application Priority Data
Dec. 10, 2004    (JP) .............................. 2004-358596

(51) Int. Cl.
*H01L 21/44* (2006.01)
*H01L 21/4763* (2006.01)
(52) U.S. Cl. ...................... 438/664; 438/538; 438/586; 438/649; 257/E21.439
(58) Field of Classification Search ................ 438/584, 438/592, 682; 257/E21.439
See application file for complete search history.

(56) References Cited

U.S. PATENT DOCUMENTS

| | | | | |
|---|---|---|---|---|
| 5,874,342 | A * | 2/1999 | Tsai et al. .................... | 438/301 |
| 6,221,764 | B1 | 4/2001 | Inoue | |
| 6,365,516 | B1 * | 4/2002 | Frenkel et al. ............... | 438/682 |
| 6,586,321 | B2 * | 7/2003 | Tai .............................. | 438/592 |
| 6,627,527 | B1 * | 9/2003 | Wang et al. ................. | 438/592 |
| 6,653,227 | B1 * | 11/2003 | Lai et al. .................... | 438/633 |
| 6,936,528 | B2 * | 8/2005 | Koo et al. ................... | 438/583 |
| 2001/0003056 | A1 * | 6/2001 | Hashimoto et al. ......... | 438/592 |

FOREIGN PATENT DOCUMENTS

JP      10-242081 A     9/1998

(Continued)

OTHER PUBLICATIONS

Li-Ye Chen et al., A manufacturing procedure for semiconductor component with a ttanium nitride / Tai (TiN / Ti) capping layer., English translation of TW 410389, Nov. 1, 2000.*

(Continued)

*Primary Examiner*—Scott B. Geyer
*Assistant Examiner*—Seahvosh Nikmanesh
(74) *Attorney, Agent, or Firm*—Westerman, Hattori, Daniels & Adrian, LLP.

(57) ABSTRACT

The method for fabricating a semiconductor device comprises the step of forming a Co film 72 on a gate electrode 30 having a gate length $L_g$ of below 50 nm including 50 nm; the first thermal processing step of making thermal processing to react the Co film 72 and the gate electrode 30 with each other to form a CoSi film 76a on the upper part of the gate electrode 30; the step of selectively etching off the unreacted part of the Co film 72; and the second thermal processing step of making thermal processing to react the CoSi film 76a and the gate electrode 30 with each other to form a $CoSi_2$ film 42a on the upper part of the gate electrode 30, wherein in the first thermal processing step, the CoSi film 76a is formed so that the ratio h/w of the height h of the CoSi film 76a to the width w of the CoSi film 76a is below 0.7 including 0.7.

18 Claims, 24 Drawing Sheets

FOREIGN PATENT DOCUMENTS

| | | |
|---|---|---|
| JP | 2001-156287 A | 6/2001 |
| JP | 2003-68670 A | 3/2003 |
| JP | 2004-140181 A | 5/2004 |
| JP | 2004186603 | 7/2004 |
| KR | 1999-0078303 | 10/1999 |
| KR | 2001-0058570 | 7/2001 |
| TW | 410389 | 11/2000 |

OTHER PUBLICATIONS

Korean Official Letter dated May 24, 2006.
Taiwanese Official Letter dated Mar. 3, 2006.
Chinese Office Action dated Jun. 8, 2007 issued in corresponding Application No. 200510066855.5.
Japanese Office Action dated Nov. 13, 2007, Application No. 2004-358596.

* cited by examiner

Lg(w)

Lg(w)

US 7,329,604 B2

SEMICONDUCTOR DEVICE AND METHOD FOR FABRICATING THE SAME

CROSS-REFERENCE TO RELATED APPLICATIONS

This application is based upon and claims priority of Japanese Patent Application No. 2004-358596, filed on Dec. 10, 2004, the contents being incorporated herein by reference.

BACKGROUND OF THE INVENTION

The present invention relates to a semiconductor device and a method for fabricating the same, more specifically, a semiconductor device including cobalt silicide film and a method for fabricating the same.

As a technique of decreasing the resistance of gate electrodes and source/drain diffused layers is known the so-called salicide (Self-Aligned Silicide) process of forming metal silicide films on their surfaces by self-alignment. In the salicide process, metal materials to be reacted with silicon are cobalt (Co), titanium (Ti), etc. are used (refer to, e.g., Japanese published unexamined patent application No. Hei 10-242081 (1998), Japanese published unexamined patent application No. 2003-68670, and Japanese published unexamined patent application No. 2001-156287).

In semiconductor devices whose structures are increasingly micronized, when a micronized gate electrode is silicided by using a Co film, the scatter of the resistance of the gate electrode is often abruptly increased. This phenomena is conspicuous in a gate electrode of a below 50 nm-gate length including 50 nm-gate length.

SUMMARY OF THE INVENTION

An object of the present invention is to provide a semiconductor device which can suppress the scatter the resistance of the gate electrodes even when a gate electrode is silicided by using a Co film, and a method for fabricating the same.

According to one aspect of the present invention, there is provided a method for fabricating a semiconductor device comprising: the step of forming a gate electrode having a gate length of below 50 nm including 50 nm over a semiconductor substrate; the step of forming a source/drain diffused layer in the semiconductor substrate on both sides of the gate electrode; the step of forming a cobalt film on the gate electrode; the first thermal processing step of reacting the cobalt film with the gate electrode to form a cobalt monosilicide film on an upper part of the gate electrode; the step of selectively etching off a part of the cobalt film, which has not reacted; and the second thermal processing step of reacting the cobalt monosilcide film with the gate electrode to form a cobalt disilicide film on the upper part of the gate electrode, wherein in the first thermal processing step, the cobalt monosilicide film is formed so that a ratio h/w of a height of the cobalt monosilicide film to a width of the cobalt monosilicide film is below 0.7 including 0.7.

According to another aspect of the present invention, there is provided a semiconductor device comprising: a gate electrode formed over a semiconductor substrate and having a gate length of below 50 nm including 50 nm; a source/drain diffused layer formed in the semiconductor substrate on both sides of the gate electrode; and a silicide film formed of cobalt disilicide alone formed on a upper part of the gate electrode.

According to the present invention, in the first thermal processing, the cobalt monosilicide film is formed so that the ratio h/w of the height h to the width w is below a prescribed value including the prescribed value, whereby in the second thermal processing, the cobalt monosilicide film can be surely phase transformed to the cobalt disilicide film. Thus, according to the present invention, even when the fine gate electrode is silicided by using a cobalt film, the sheet resistance of the gate electrode can be sufficiently decreased, and the scatter of the sheet resistance can be surely suppressed.

DETAILED DESCRIPTION OF THE INVENTION

[Principle of the Present Invention]

The principle of the present invention will be explained with reference to FIGS. 1 to 10.

So far in the silicidation process for forming a $CoSi_2$ film on a gate electrode and source/drain diffused layers, thermal processing is performed in the steps of forming a silicide film of cobalt monosilicide (CoSi) phase, whose resistance is relatively higher and forming a silicide film of cobalt disilicide (CoSi$_2$) phase, whose resistance is low. That is, first, a Co film and a protection film of Ti film, TiN film or others are sequentially deposited on the gate electrode and the source/drain diffused layers, and then first thermal processing is performed at a relatively low temperature of, e.g., about 500° C. Thus, the silicide film (CoSi film) of the relatively high resistance CoSi phase is formed. Next, the protection film and the unreacted Co film are selectively etched off, and then second thermal processing is performed at a relatively high temperature of, e.g., about 700° C. Thus, the silicide film of the relatively high resistance CoSi phase is phase transformed to the silicide film (CoSi$_2$ film) of the low resistance CoSi$_2$ phase. In the specification of the present application, when the compositions of the cobalt silicide are made explicit, "cobalt monosilicide (CoSi)" and "cobalt disilicide (CoSi$_2$)" are used.

However, when the gate length $L_g$ of the gate electrode is below 50 nm including 50 nm and furthermore below 40 nm including 40 nm, the sheet resistance of the gate electrode is increased, and the scatter of the sheet resistance is often increased.

Figure 1:
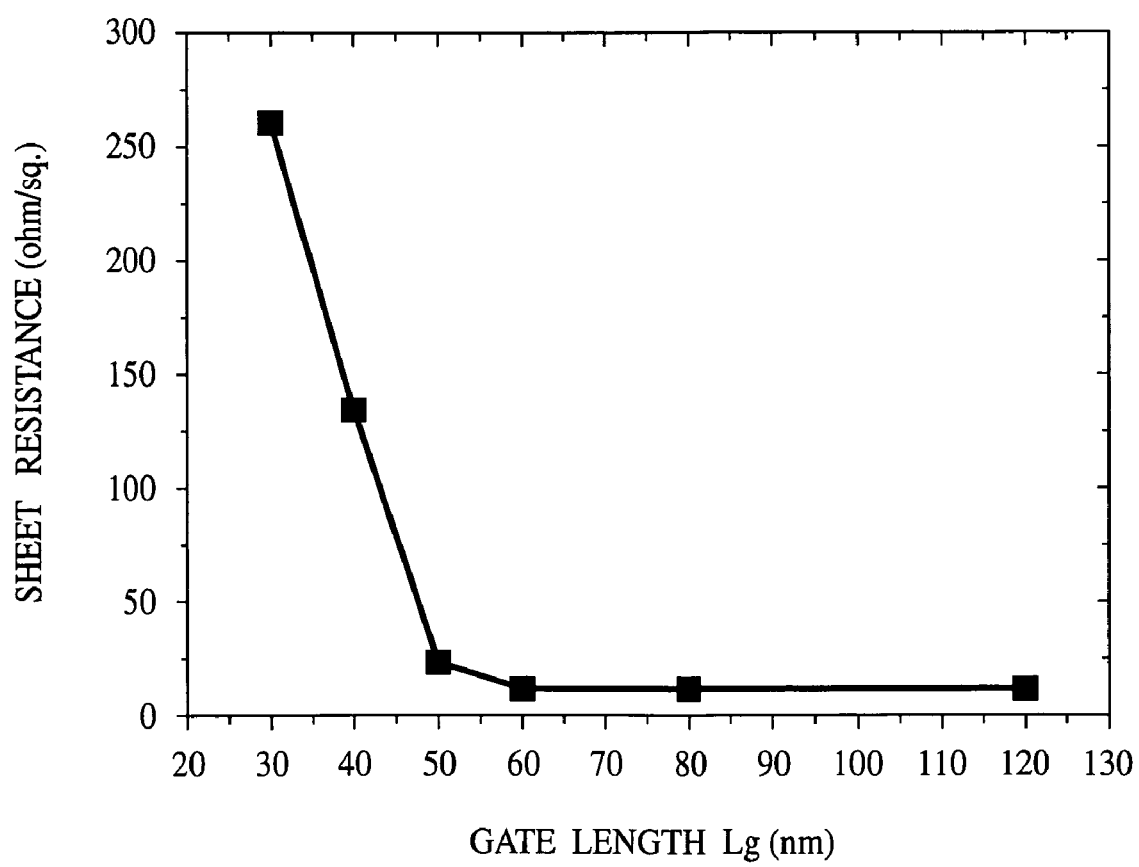
FIG. 1 is a graph of relationships between the gate length $L_g$ of the gate electrode having the upper part silicided by using a Co film, and the sheet resistance of the gate electrode.

FIG. 1 is a graph of relationships between the gate length $L_g$ of a gate electrode with the upper part silicided by using a Co film and the sheet resistance of the gate electrode. Gate lengths $L_g$ are taken on the horizontal axis, and sheet resistances of the gate electrode are taken on the vertical axis.

As shown in FIG. 1, it is found that when the gate length is below 50 nm including 50 nm, the sheet resistance of the gate electrode is abruptly increased.

Figure 2:
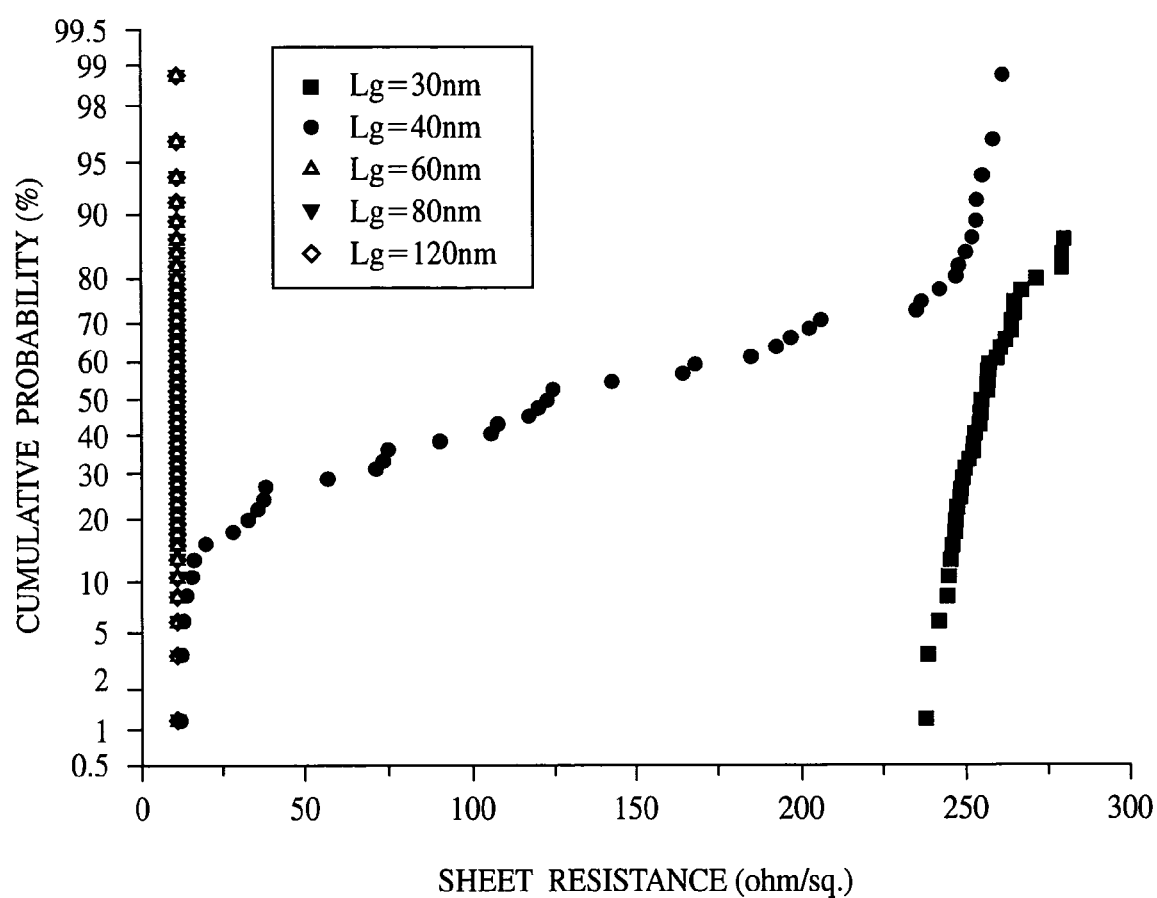
FIG. 2 is a graph of cumulative probability distributions of the sheet resistance of the gate electrode having the upper part silicided by using a Co film.

FIG. 2 is a graph of the cumulative probability distributions of the sheet resistance of a gate electrode with the upper part silicided by using a Co film. Sheet resistances of the gate electrode are taken on the horizontal axis, and cumulative probabilities are taken on the vertical axis. The ■-marked plots indicate cumulative probabilities for the gate length $L_g$ of 30 nm; the ●-marked plots indicate cumulative probabilities for the gate length $L_g$ of 40 nm; the ▲-marked plots indicate cumulative probabilities for the gate length $L_g$ of 60 nm; the ▼-marked plots indicate cumulative probabilities for the gate length $L_g$ of 80 nm; and the ◇-marked plots indicate cumulative probabilities for the gate length $L_g$ of 120 nm.

As evident in comparison among the plots of the respective cases shown in FIG. 2, with the gate lengths of 40 nm and 30 nm, the sheet resistance of the gate electrode largely scatters in comparison with that with the rest gate lengths.

It is conceivable that the above-described increase of the sheet resistance and increase of the scatter of the sheet resistance is due to the suppression of the phase transformation from the silicide film of the relatively high resistance CoSi phase to the silicide film of the low resistance CoSi$_2$ phase in the second thermal processing as the gate length $L_g$ becomes shorter. The relationship between the phase transformation from the silicide film of the relatively high resistance CoSi phase to the silicide film of the low resistance CoSi$_2$ phase, and the gate length $L_g$ will be explained in terms of thermodynamics below.

Figure 3A:
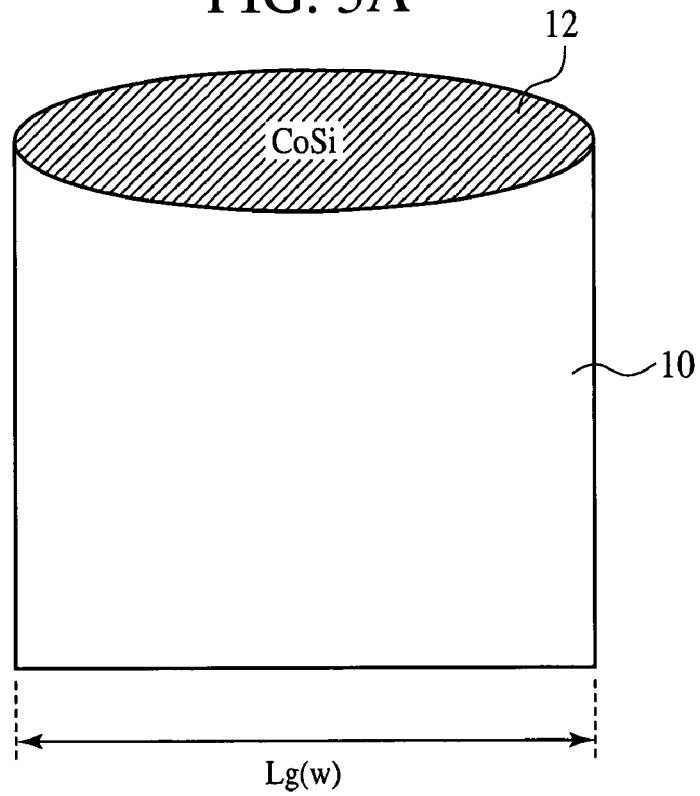
FIGS. 3A-3B are diagrammatic sectional views of the gate electrode of a relatively large gate length $L_g$, which illustrates the silicidation process.
Figure 3B:
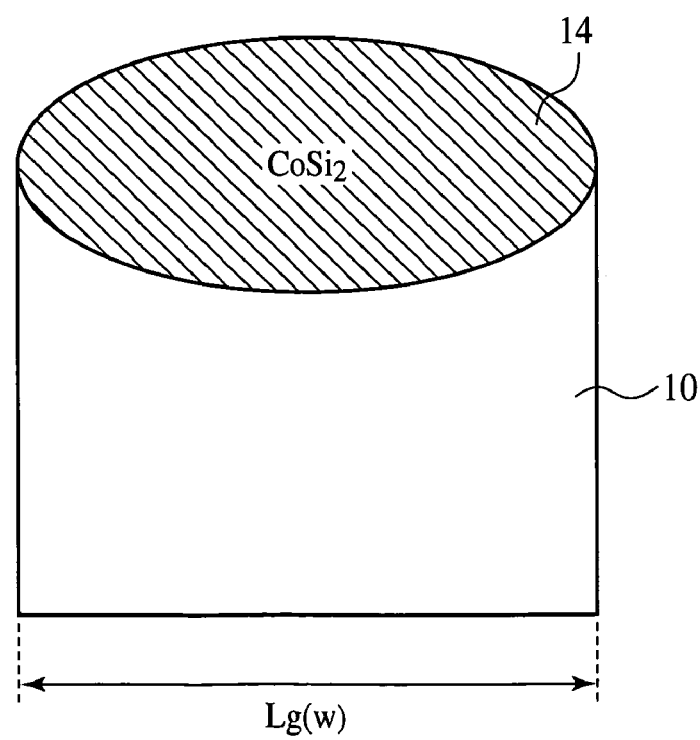

FIGS. 3A-3B are diagrammatic sectional views of the silicide film of the CoSi phase and the silicide film of the CoSi$_2$ phase with the gate length $L_g$ being relatively large, which illustrate the silicidation process. FIG. 3A illustrates the silicide film 12 of the CoSi phase formed on a gate electrode 10 by the first thermal processing, and FIG. 3B illustrates the silicide film 14 of the CoSi$_2$ phase formed on the gate electrode by the second thermal processing.

Figure 4A:
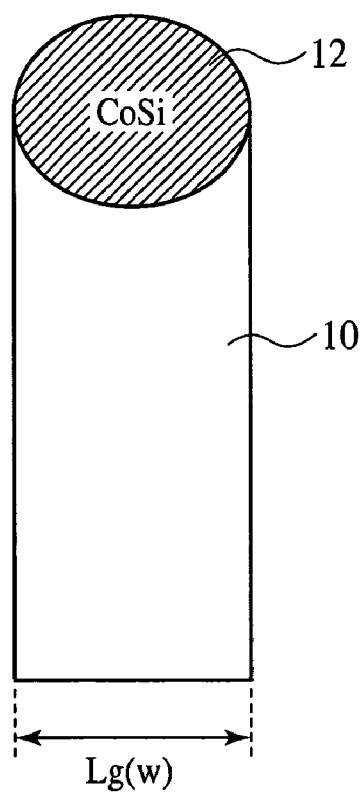
FIGS. 4A-4B are diagrammatic sectional views of the gate electrode of a relatively small gate length $L_g$, which illustrates the silicidation process.
Figure 4B:
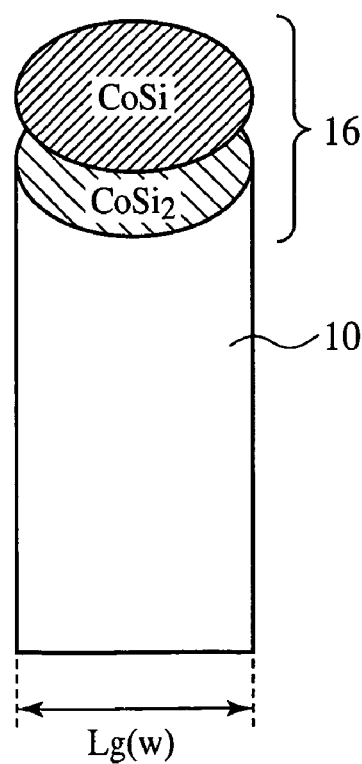

FIGS. 4A-4B are diagrammatic sectional views of the silicide film of the CoSi phase and the silicide film of the CoSi$_2$ phase with the gate length $L_g$ being relatively small, which illustrate the silicidation process. FIG. 4A illustrates the silicide film 12 of the CoSi phase formed on a gate electrode 10 by the first thermal processing, and FIG. 4B illustrates the silicide film 16 having the CoSi phase and the CoSi$_2$ phase mixedly formed by the second thermal processing.

The sectional shape of the silicide film 12 of the CoSi phase and the silicide film 14 of the CoSi$_2$ phase can be considered an ellipse having the transverse length of a gate length $L_g$. The surface area of the silicide films 12, 14 becomes larger as the aspect ratio of the ellipse of the silicide films 12, 14 becomes smaller or larger from 1, and the silicide films 12, 14 become unstable in terms of energy. On the other hand, as the aspect ratio of the ellipse becomes nearer to 1, i.e., the ellipse more approximates to a circle, the surface area of the silicide films 12, 14 becomes smaller, and the silicide films 12, 14 become stable in terms of energy. In other words, as the ratio h/w of the height h of the silicide films 12, 14 to the width w of the silicide films 12, 14 becomes smaller or larger from 1, the surface area of the silicide films 12, 14 becomes larger, and the silicide films 12, 14 become unstable in terms of energy. On the other hand, as the ration h/w becomes nearer to 1, the surface area of the silicide films 12, 14 becomes smaller, and the silicide films 12, 14 become stable in terms of energy. Here, the width w of the silicide films 12, 14 corresponds to the gate length $L_g$ of the gate electrode 10. That is, the width w of the silicide films 12, 14 means the length of the silicide films 12, 14 in the direction of the channel of the transistor.

When the gate length $L_g$ is relatively large, the sectional shape of the silicide film 12 of the CoSi phase formed after the first thermal processing, as illustrated in FIG. 3A, is an ellipse of a small aspect ratio because of the large gate length $L_g$. In other words, the ratio h/w of the height h of the silicide film 12 of the CoSi phase to the width w of the silicide film 12 of the CoSi phase is small remotely from 1. Accordingly, the silicide film 12 of the CoSi phase has a large surface area and is unstable in terms of energy. When the second thermal processing is made on such silicide film 12 of the CoSi phase, the reaction advances to make the silicide film stable in terms of energy. The silicide film which is stable in terms of energy is the silicide film 14 of the CoSi$_2$ phase, whose elliptical sectional shape has an aspect ratio nearer to 1 in comparison with the silicide film 12 of CoSi phase, as shown in FIG. 3B. In other words, the silicide film which is stable in terms of energy is the silicide film 14 of the CoSi$_2$ phase, whose ratio h/w of the height h to the width w is nearer to 1. Accordingly, the silicide film 12 of the CoSi phase is formed to have an elliptical section of a small aspect ratio, whereby the silicide film 12 of the CoSi phase easily reacts with the gate electrode 10 in the second thermal processing and is phase transformed into the silicide film 14 of the CoSi$_2$ phase without failure. In other words, the silicide film 12 of the CoSi phase is formed to have a small ratio h/w of the height h to the width w, whereby the silicide film 12 of the CoSi phase is phase transformed into the silicide film 14 of the CoSi$_2$ phase without failure.

Thus, when the gate length $L_g$ is relatively large, the silicide film of the CoSi$_2$ phase of low resistance will be formed without failure on the gate electrode after the second thermal processing. Resultantly, the sheet resistance of the gate electrode will be decreased, and the scatter of the sheet resistance will be suppressed.

When the gate length $L_g$ is relatively small, however, as illustrated in FIG. 4A, the sectional shape of the silicide film 12 of the CoSi phase formed after the first thermal processing is an ellipse approximate to a circle because of the small gate length $L_g$. In other words, the ratio h/w of the height h of the silicide film 12 of the CoSi phase to the width w of the silicide film 12 of the CoSi phase has a value approximate to 1. Accordingly, the silicide film 12 of the CoSi phase after the first thermal processing has become stable in terms of energy. Even by the second thermal processing, the phase transformation does not easily advance from the silicide film 12 of the CoSi phase shown in FIG. 4A, which is stable in terms of energy, to the silicide film of the $CoSi_2$ phase.

Accordingly, with the gate length $L_g$ being relatively small, as illustrated in FIG. 4B, on the gate electrode 10 after the second thermal processing, a silicide film 16 of the CoSi phase of relatively high resistance and the $CoSi_2$ phase of relatively low resistance mixed with each other will be formed. Resultantly, the sheet resistance of the gate electrode 10 will be increased, and the scatter of the sheet resistance will be increased.

Figure 5A:
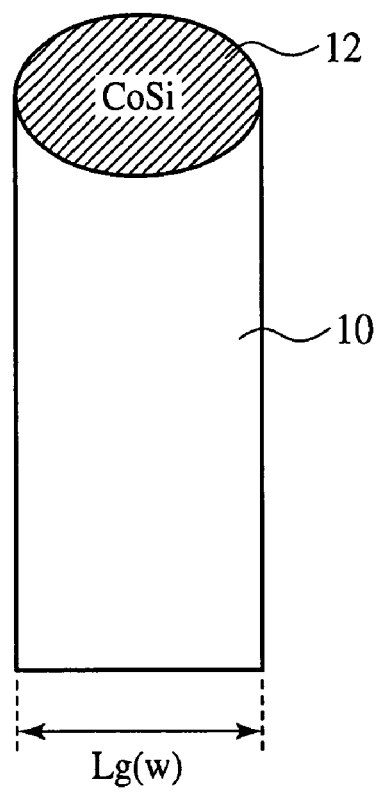
FIGS. 5A-5B are diagrammatic sectional views of the gate electrode, which illustrate the silicidation process of the present invention.
Figure 5B:
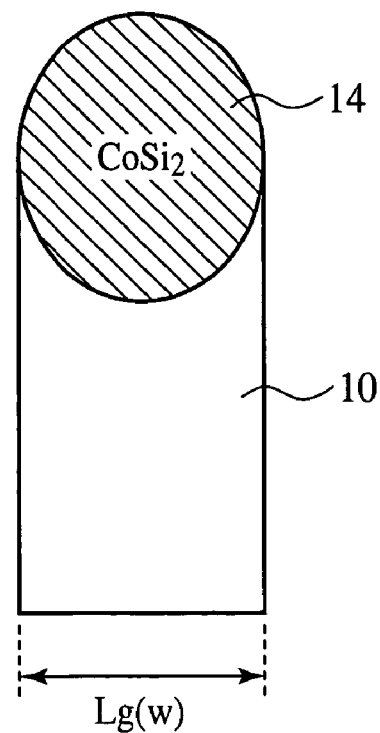

The present invention ensures the phase transformation from the silicide film of the CoSi phase to the silicide film of the $CoSi_2$ phase when the gate length $L_g$ is as short as, e.g., below 50 nm including 50 nm, whereby the sheet resistance of the gate electrode can be decreased, and the scatter of the sheet resistance can be suppressed. FIGS. 5A-5B are diagrammatic sectional views illustrating the silicidation process of the present invention. As illustrated, the film thickness, etc. of the a Co film to be deposited are suitably preset, whereby a silicide film 12 of the CoSi phase can be formed on the gate electrode 10 by the first thermal processing in the ratio h/w of below a prescribed value of the height h to the width w. The second thermal processing is made on the silicide film 12 of the CoSi phase, whereby the phase transformation from the silicide film 12 of the CoSi phase to the silicide film 14 of the $CoSi_2$ phase is made without failure to form the silicide film 14 of the $CoSi_2$ phase alone on the gate electrode 10. The setting, etc. of the ratio h/w of the height h of the silicide film 12 of the CoSi phase to the width w of the silicide film 12 of the CoSi phase will be detailed.

The inventor of the present application made the following simulation so as to make clear the mechanism for siliciding fine gate electrodes by using a Co film.

Figure 6A:
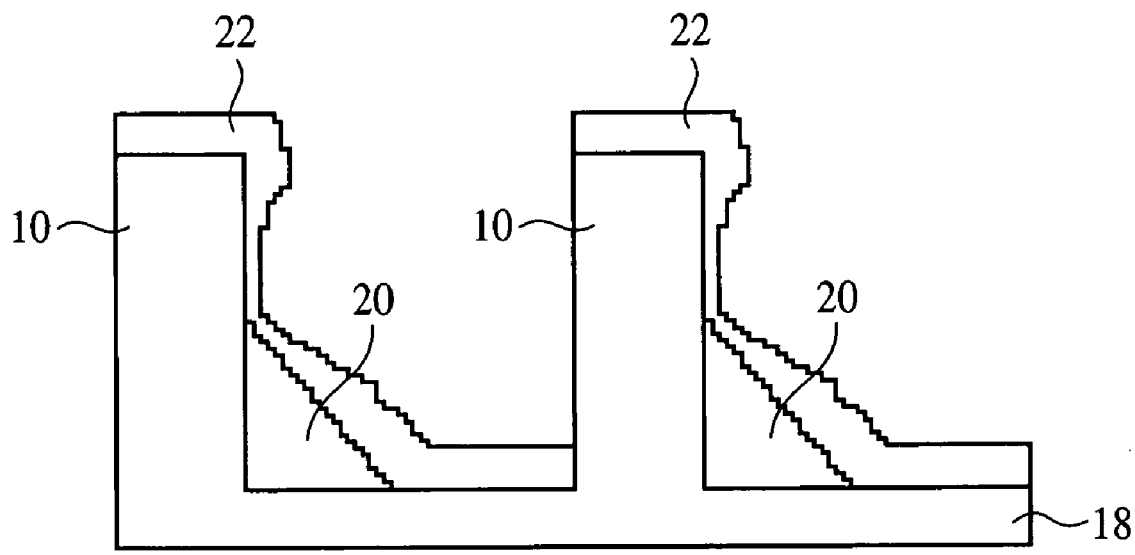
FIGS. 6A-6B are views illustrating the sectional shape of the Co film deposited by sputtering by simulation.

The sectional shape of a Co film deposited by sputtering was given by simulation. In the simulation, the Co film was deposited by sputtering on a substrate with gate electrodes of polysilicon and sidewall insulation films formed on. In the simulation, the structure on one side of the sidewalls of the gate electrode was omitted. FIG. 6A is a sectional view illustrating the result of the simulation. In FIG. 6A, the sectional structure of the gate electrodes 10 formed on the substrate 18, the sidewall insulation films 20 formed on the side walls of the gate electrodes 10 and the Co film deposited by sputtering, which were given by the simulation are shown.

As evident in FIG. 6A, when the Co film 22 is deposited by sputtering, the Co film 22 is deposited not only on the upper surface of the gate electrode 10 but also on the side walls of the gate electrode 10.

Figure 6B:
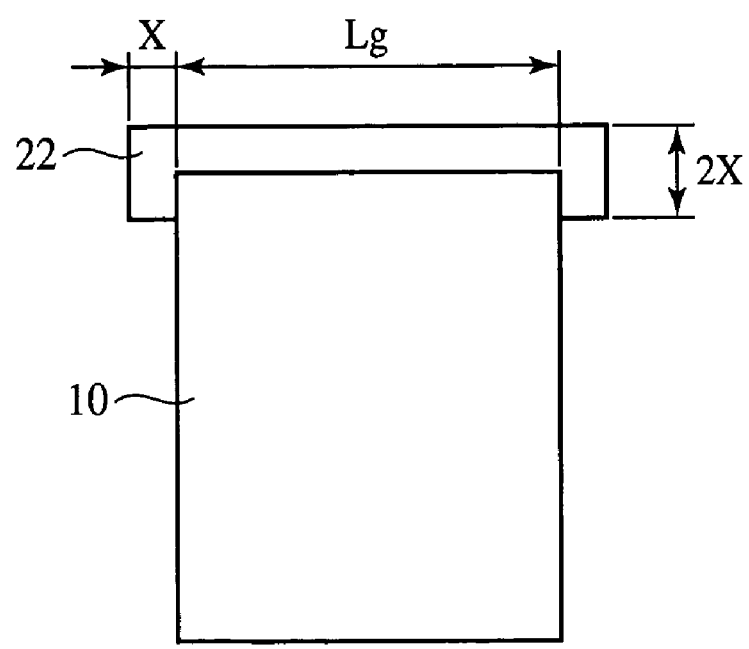

Based on the simulation result shown in FIG. 6A, the Co film 22 which contributes to the silicidation reaction for the upper part of the gate electrode 10 can be presumed. FIG. 6B is a schematic sectional view of the Co film which is considered to contribute to the silicidation reaction for the upper part of the gate electrode.

As illustrated in FIG. 6B, when a film thickness of the deposited Co film 22 is X nm, a sectional area S of the Co film 22 which contributes to the silicidation reaction for the upper part of the gate electrode 10 of a gate length $L_g$ can be approximated by the following formula.

$$S = L_g \times X + 4 \times X^2 \quad (1)$$

The sectional area S is proportional to the total quantity of the Co which contributes to the silicidation reaction.

As evident in Formula (1), as the gate length $L_g$ is shorter, the second term of Formula (1), $4 \times X^2$ is more influential to the sectional area S. For example, when the gate length $L_g$ is 40 nm, and the film thickness X of the Co film 22 is 10 nm, the sectional area S is 800 $nm^2$. This sectional area S corresponds to the sectional area of the Co film 22 of a 20 nm-film thickness which is formed only on the upper surface of the gate electrode 10 but is not formed on the side walls of the gate electrode 10.

Thus, as the gate length $L_g$ is shorter, the contribution of the Co film deposited on the side walls of the gate electrode to the silicidation reaction becomes more unignorable. A film thickness of the Co film to be deposited must be set in consideration of this point.

Figure 7A:
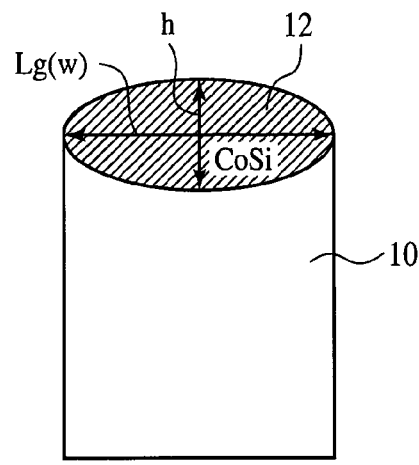
FIG. 7A is a diagrammatic sectional view of the silicide film of the CoSi phase formed on the gate electrode, which illustrates the elliptical sectional shape of the silicide film of the CoSi phase.
Figure 7B:
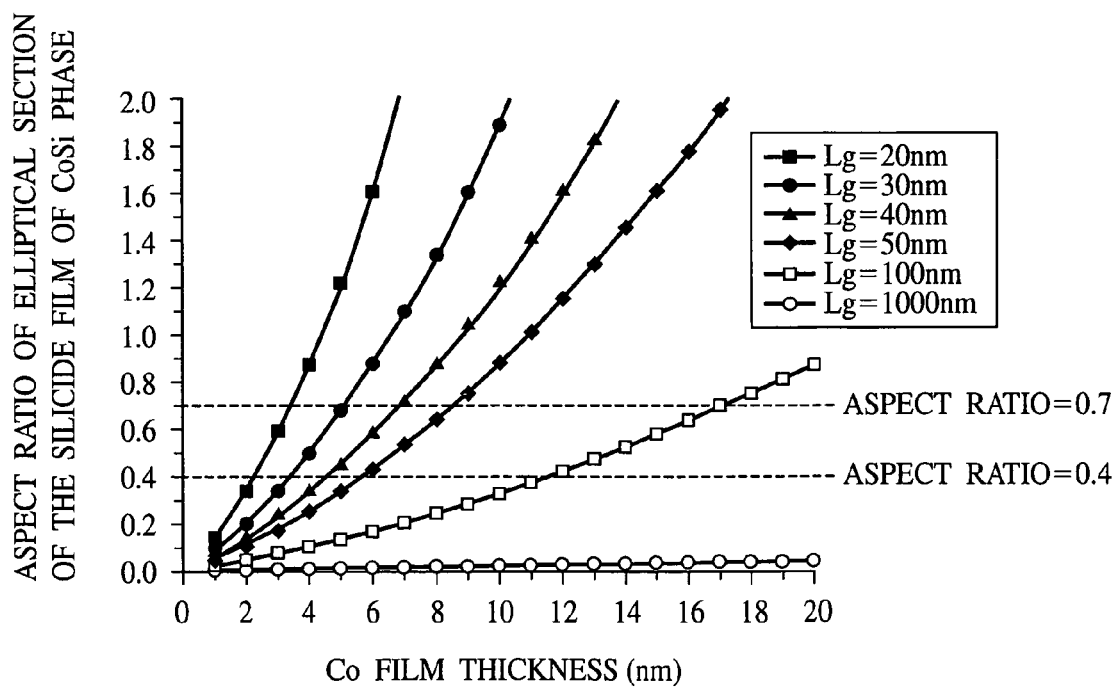
FIG. 7B is a graph of relationships between the aspect ratio of the elliptical section of the silicide film of the CoSi phase and the film thickness of the Co film by simulation.

Next, for the silicide film 12 of the CoSi phase of an elliptical sectional shape on the gate electrode 10 after the first thermal processing as illustrated in FIG. 7A, the relationships between the aspect ratio of the ellipse and the film thickness of the Co film were given by simulation. FIG. 7B is a graph showing the result of the simulation. The film thickness of the Co film is taken on the horizontal axis of the graph, and, the aspect ratio of the elliptical section of the silicide film of the CoSi phase is taken on the vertical axis of the graph.

In the simulation, the transverse length of the elliptical section of the silicide film of the CoSi phase is $L_g$, and the vertical length h is given, based on a reaction quantity of the Co, and the aspect ratio of the ellipse was computed in $h/L_g$. The simulation was made for the gate lengths $L_g$ of 20 nm, 30 nm, 40 nm, 50 nm, 100 nm and 1000 nm. In the graph of FIG. 7B, the ■-marked plots indicate the simulation result for the 20 nm-gate length $L_g$; the ●-marked plots indicate the simulation result for the 30 nm-gate length $L_g$; the ▲-marked plots indicate the simulation result for the 40 nm-gate length $L_g$; the ♦-marked plots indicate the simulation result for the 50 nm-gate length $L_g$; the □-marked plots indicate the simulation result for the 100 nm-gate length $L_g$; and the ○-marked plots indicate the simulation result for the 1000 nm-gate length $L_g$.

As evident in the graph of FIG. 7B, for all the gate lengths $L_g$, as the film thickness of the Co film is larger, the aspect ratio of the elliptical section of the silicide film of the CoSi phase tends to increase. This tendency of the aspect ratio increasing is more conspicuous as the gate length $L_g$ is smaller.

The phase transformation of the silicide film by the second thermal processing is influenced by factors, such as the processing (pre-processing) before the Co film is deposited, conditions for depositing the Co film, the concentration of an impurity to be implanted into the gate electrode, etc., the protection film to be formed on the Co film, the thermal processing temperature, the thermal processing period of time, etc.

Figure 8:
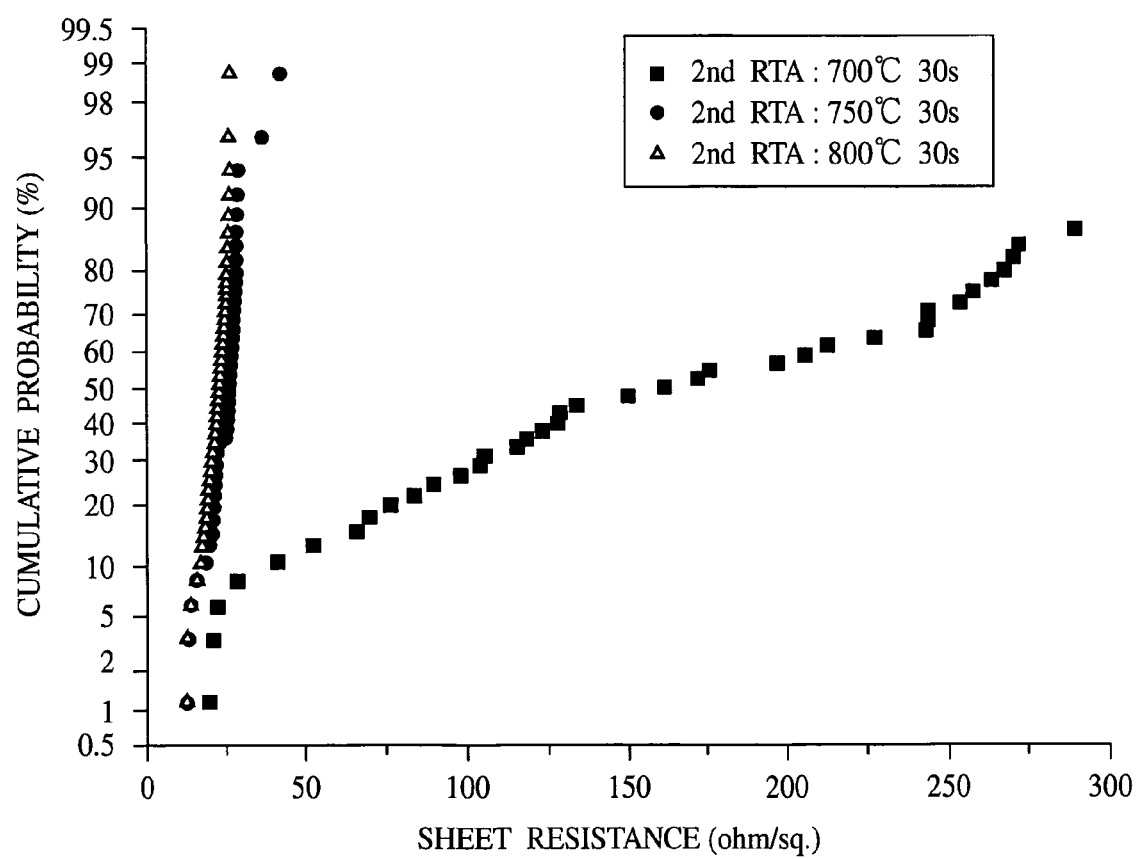
FIG. 8 is a graph of relationships between the temperature of the second thermal processing for the silicidiation using a Co film, and the sheet resistance of the gate electrode.

For example, FIG. 8 is the graph of the relationships between the temperature of the second thermal processing for the silicidation using the Co film, and the sheet resistance of the gate electrodes. The gate electrodes of a 40 nm-gate length $L_g$ were silicided by using the Co film, and the sheet resistance was measured on the gate electrodes subjected to the first thermal processing and the second thermal processing, and the cumulative probability distribution was plotted. The cumulative probability distribution was measured for 700° C., 750° C. and 800° C. of the second thermal processing. In all the thermal processing, RTA was used, and the thermal processing period of time was 30 seconds. In the graph, the ■-marked plots are of the measured result of the second thermal processing of 700° C.; the ●-marked plots are of the measured result of the second thermal processing of 750° C.; and the Δ-marked plots are of the measured result of the second thermal processing of 800° C.

As evident in the comparison among the respective plots in FIG. 8, depending on the temperature of the second thermal processing, the cumulative probability distribution of the sheet resistance largely differs. As the temperature of the second thermal processing is higher, the scatter of the sheet resistance is more suppressed.

As described above, the sheet resistance of the gate electrode silicided by using a Co film is influenced by various factors, such as the thermal processing temperature, etc.

Figure 9:
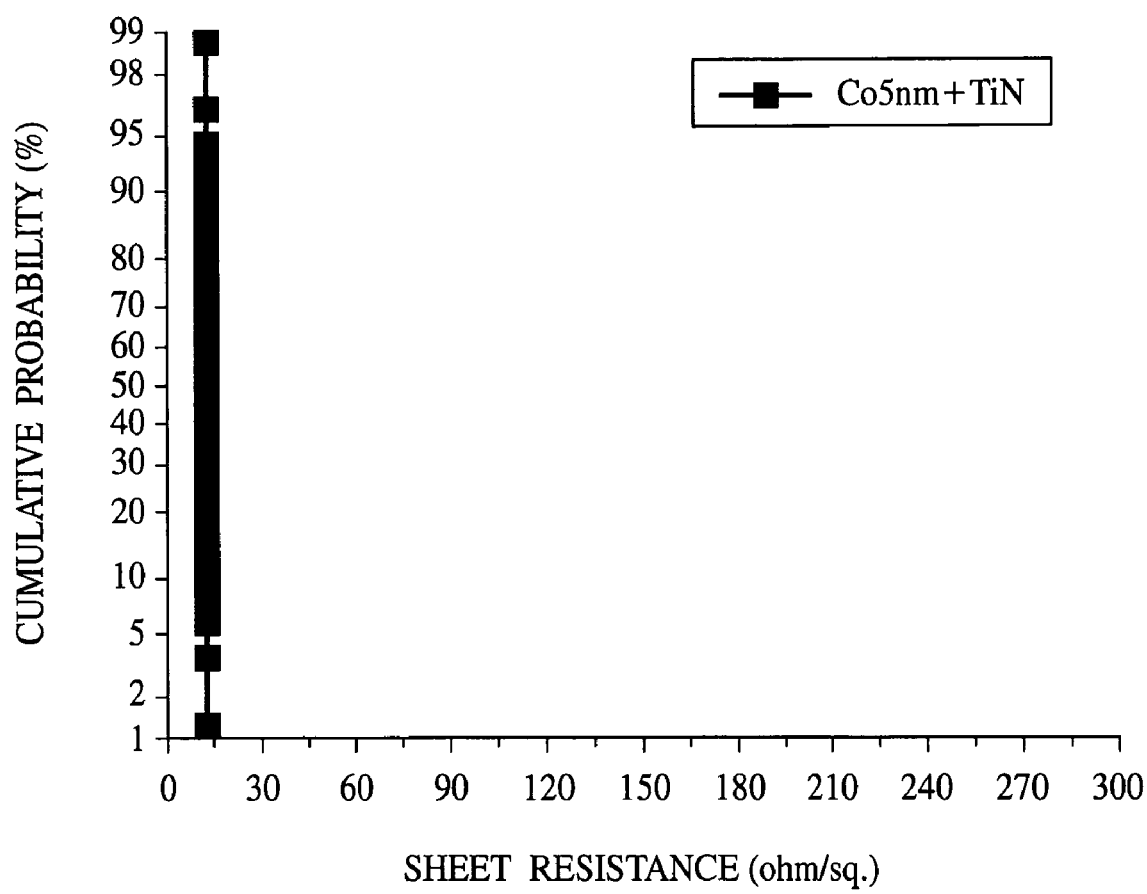
FIG. 9 is a graph of the cumulative probability distribution of the sheet resistance of the gate electrode of a 30 nm-gate length $L_g$ whose upper part has been silicided by depositing a Co film of a 5 nm-thickness.

FIG. 9 is a graph of the cumulative probability distribution of the sheet resistance of the gate electrodes of a 30 nm-gate length $L_g$ having the upper part silicided by depositing a 5 nm-thickness Co film. The aspect ratio of the section of the silicide film of the CoSi phase formed by the first thermal processing was set at 0.7. In the silicidation, optimum conditions were set for the processing before the deposition of the Co film, the impurity concentration of the gate electrode, the protection film to be formed on the Co film, the annealing temperature and period of time, etc. Specifically, the impurity to be implanted into the gate electrode was an N type dopant, and the concentration of the impurity was $3\times10^{20}$ atoms/cm$^3$. As the processing before the deposition of the Co film, hydrofluoric acid processing corresponding to the removal of a 5 nm-film thickness of the thermal oxide film of $SiO_2$ was performed. As the protection film to be formed on the Co film, a 5 nm-thickness TiN film was deposited. In the first thermal processing, the temperature of the thermal processing was 500° C., and the thermal processing period of time was 30 seconds. In the second thermal processing, the temperature of the thermal processing was 700° C., and the thermal processing period of time was 30 seconds.

As evident in FIG. 9, even when the gate electrodes of a 30 nm-gate length $L_g$ have been silicided, the scatter of the sheet resistance is suppressed.

As described above, when the aspect ratio of the elliptical section of the silicide film of the CoSi phase is set at 0.7, in other words, the ratio h/w of the height h of the silicide film of the CoSi phase to the width w of the silicide film of the CoSi phase is set at 0.7, respective conditions for the silicidation are optimized, whereby the phase transformation from the silicide film of the CoSi phase to the silicide film of the $CoSi_2$ phase can be ensured without failure. Thus, the sheet resistance of the gate electrode can be decreased, and the scatter of the sheet resistance can be suppressed.

The film thickness of the Co film which permits the aspect ratio of the elliptical section of the silicide film of the CoSi phase formed by the first thermal processing to be below 0.7 including 0.7, in other words, the ratio h/w of the height h of the silicide film of the CoSi phase to the width w of the CoSi film of the CoSi phase to be below 0.7 including 0.7 can be given based on the simulation result shown in FIG. 7B. For example, when the gate length $L_g$ is 20 nm, the film thickness of the Co film may be set at below 3.5 nm including 3.5 nm. When the gate length $L_g$ is 30 nm, the film thickness of the Co film may be set at, e.g., below 5 nm including 5 nm. When the gate length $L_g$ is 40 nm, the film thickness of the Co film may be set at, e.g., below 7 nm including 7 nm. When the gate length $L_g$ is 50 nm, the film thickness of the Co film may be set at, e.g., below 9 nm including 9 nm.

When the aspect ratio of the section of the silicide film of the CoSi phase formed by the first thermal processing is above 0.7, it is difficult to ensure the phase transformation from the silicide film of the CoSi phase to the silcide film of the $CoSi_2$ phase even under respective conditions optimized for the silicidation. This is because when the aspect ratio of the section of the silicide film of the CoSi phase formed by the first thermal processing is above 0.7, the silicide film of the CoSi phase is considerably stable in terms energy.

As described above, respective conditions for the silicidation are optimized, whereby even when the aspect ratio of the silicide film of the CoSi phase formed by the first thermal processing is set to be relatively large at 0.7, the silicide film of the CoSi phase can be phase transformed to the silicide film of the $CoSi_2$ phase. However, it is not easy in the fabrication process to make all respective conditions for the silicidation optimum.

However, the film thickness of the Co film is set in advance so that the aspect ratio of the section of the silicide film of the CoSi phase is below 0.4 including 0.4, in other words, the ratio h/w of to the height h of the silicide film of the CoSi phase to the width w of the silicide film of the CoSi phase is below 0.4 including 0.4, whereby the phase transformation from the silicide film of the CoSi phase to the silcide film of the $CoSi_2$ phase can be advanced even without sufficiently optimizing respective conditions of the silicidation. This is because when the aspect ratio of the section of the silicide film of the CoSi phase formed by the first thermal processing is below 0.4 including 0.4, the silicide film of the CoSi phase is very unsable in terms of energy. Accordingly, the aspect ratio of the silicide film of the CoSi phase formed by the first thermal processing is set at below 0.4 including 0.4, whereby the sheet resistance of the gate electrode can be decreased, and the scatter of the sheet resistance can be suppressed.

The film thickness of the Co film which permits the aspect ratio of the elliptical section of the silicide film of the CoSi phase formed by the first thermal processing to be below 0.4 including 0.4, in other words, the ratio h/w of the height h of the silicide film of the CoSi phase to the width w of the CoSi film of the CoSi phase to be below 0.4 including 0.4 can be given based on the simulation result shown in FIG. 7B. For example, when the gate length $L_g$ is 20 nm, the film thickness of the Co film may be set at below 2 nm including 2 nm. When the gate length $L_g$ is 30 nm, the film thickness of the Co film may be set at, e.g., below 3 nm including 3 nm. When the gate length $L_g$ is 40 nm, the film thickness of the Co film may be set at, e.g., below 4.5 nm including 4.5 nm. When the gate length $L_g$ is 50 nm, the film thickness of the Co film may be set at, e.g., below 6 nm including 6 nm.

The present invention has been made based on the above-described investigation result. The film thickness of the Co film to be deposited is set in advance so that when the gate length $L_g$ is as short as, e.g., below 50 nm including 50 nm, the aspect ratio of the elliptical section of the silicide film of the CoSi phase formed by the first thermal processing is below 0.7 including 0.7, more preferably below 0.4 including 0.4, in other words, the ratio h/w of the height of the silicide film of the CoSi phase to the width w of the silicide film of the CoSi phase is below 0.7 including 0.7, more preferably below 0.4 including 0.4, whereby the scatter of the sheet resistance of the silicided gate electrode can be suppressed.

Next, the silicide film of the $CoSi_2$ phase alone formed by the second thermal processing will be explained with the film thickness of the Co film being set so that the aspect ratio of the elliptical section of the silicide film of the CoSi phase formed by the first thermal processing is below 0.7 including 0.7, more preferably below 0.4 including 0.4.

Figure 10:
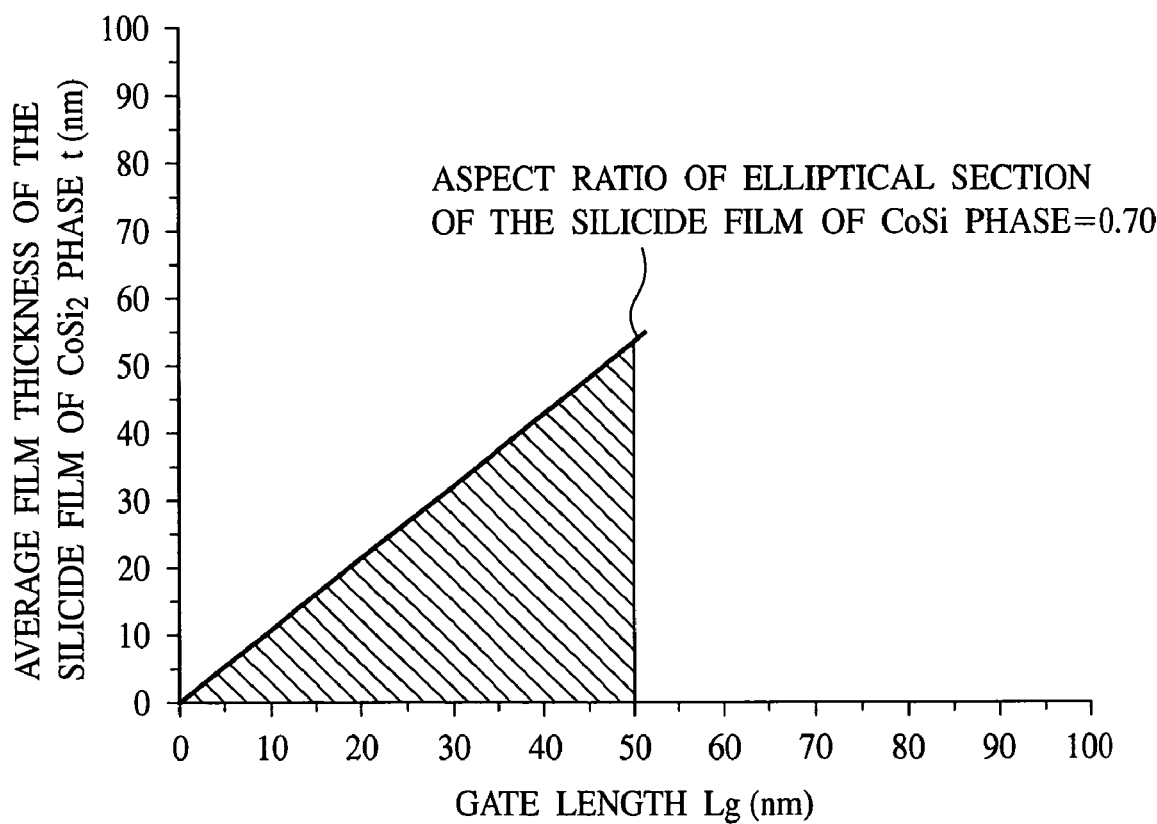
FIG. 10 is a graph of relationships between the aspect ratio of the section of the silicide film of the CoSi phase formed by the first thermal processing, the average film thickness t of the silicide film of the $CoSi_2$ phase formed by the second thermal processing, and the gate length $L_g$.

FIG. 10 is a graph of the relationship between the aspect ratio of the section of the silicide film of the CoSi phase formed by the first thermal processing, the average film thickness t of the silicide film of the $CoSi_2$ phase formed by the second thermal processing, and the gate length $L_g$. In the graph, the gate length $L_g$ is taken on the horizontal axis, and the average film thickness t of the silicide film of the $CoSi_2$ phase is taken on the vertical axis. The region where the aspect ratio of the elliptical section of the silicide film of the CoSi phase formed by the first thermal processing is below 0.7 including 0.7 is indicated by slant lines.

In the shaded region with slant lines in FIG. 10, the ratio $t/L_g$ of the average film thickness t of the silicide film of the $CoSi_2$ phase alone to the gate length $L_g$ is below 1.07 including 1.07. The aspect ratio of the elliptical section of the silicide film of the $CoSi_2$ phase alone at this time is below 1.23 including 1.23. The value, 1.23 was derived by the following computation. For example, the height of the elliptical section of the silicide film of the CoSi phase is 7 nm, and the width thereof is 10 nm. The height of the silicide film of the $CoSi_2$ phase alone formed at this time is 3.51/2 times of the height of the silicide film of the CoSi phase when it is taken into consideration that the width remains 10 nm. The value, 3.51/2 times was given by experiments and simulations made by the inventor of the present application. Accordingly, the height of the silicide film of the $CoSi_2$ phase alone is 7×3.51/2=12.285 nm. Therefore, the aspect ratio of the silicide film of the $CoSi_2$ phase alone is 12.285/10=about 1.23.

When the aspect ratio of the elliptical section of the silicide film of the CoSi phase formed by the first thermal processing is below 0.4 including 0.4, the ratio $t/L_g$ of the average film thickness t of the silicide film of the $CoSi_2$ phase alone to the gate length $L_g$ is below 0.55 including 0.55. The aspect ratio of the elliptical section of the silicide film of the $CoSi_2$ phase alone at this time is below 0.70 including 0.70.

ONE EMBODIMENT

Figure 11:
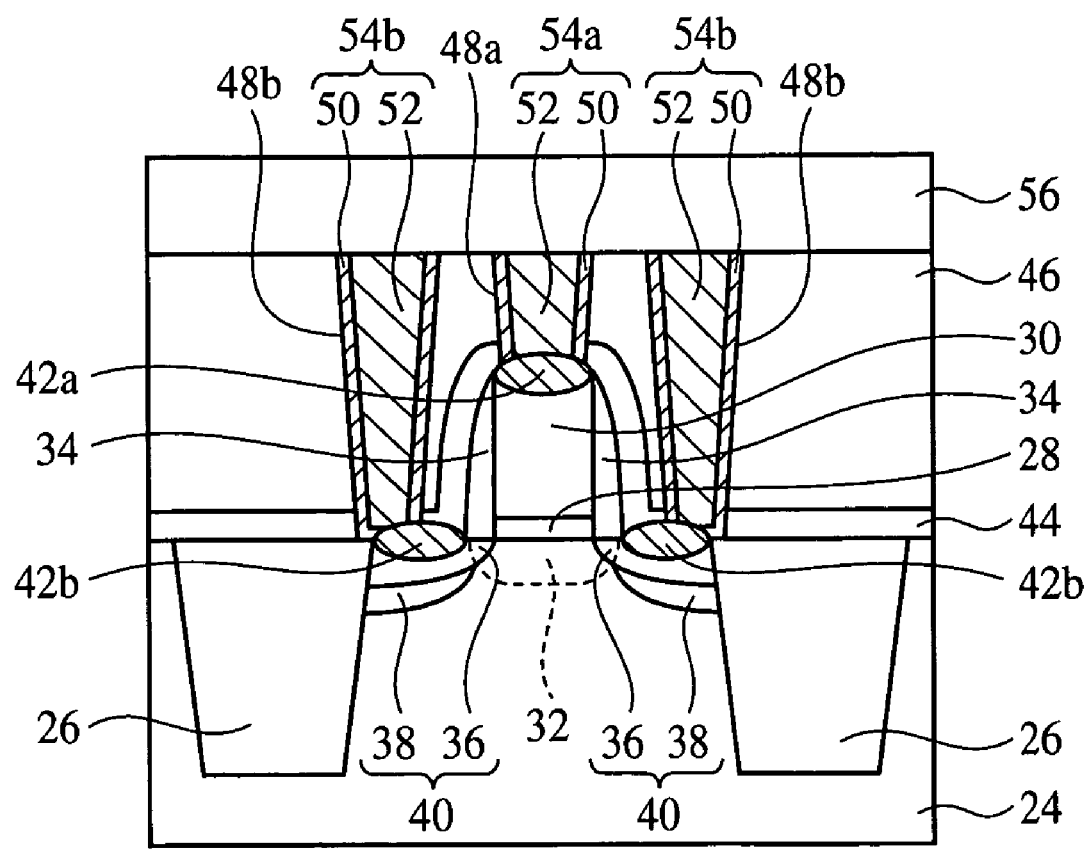
FIG. 11 is a sectional view of the semiconductor device according to one embodiment of the present invention, which illustrates a structure thereof.

The semiconductor device and the method for fabricating the same according to one embodiment of the present invention will be explained with reference to FIGS. 11 to 24. FIG. 11 is a sectional view of the semiconductor device according to the present embodiment, which illustrates a structure thereof. FIGS. 12A-12C to 23A-23B are sectional views of the semiconductor device according to the present embodiment in the steps of the method for fabricating the same, which illustrate the method. FIG. 24 is a graph of the result of evaluating the method for fabricating the semiconductor device according to the present embodiment.

First, the structure of the semiconductor device according to the present embodiment will be explained with reference to FIG. 11.

A device isolation region 26 defining a device region is formed on a silicon substrate 24. A well (not illustrated) is formed in the silicon substrate 24 with the device isolation region 26 formed on.

On the silicon substrate 24 with the well formed in, a gate electrode 30 of polysilicon film is formed with a gate insulation film 28 of silicon oxide film formed therebetween. The gate length $L_g$ of the gate electrode 30 is below 50 nm including 50 nm, e.g., 40 nm.

A channel doped layer 32 is formed below the gate electrode 30 in the silicon substrate 24.

A sidewall insulation film 34 is formed on the side walls of the gate electrode 30.

Source/drain diffused layers 40 formed of impurity diffused region 36 forming the extension region of the extension source/drain structure and deep impurity diffused region 38 are formed in the silicon substrate 24 on both sides of the gate electrode 30.

On the upper part of the gate electrode 30, a $CoSi_2$ film 42a, i.e., a silicide film 42a of $CoSi_2$ alone is formed. The sectional shape of the $CoSi_2$ film 42 is elliptical. The average thickness t of the $CoSi_2$ film 42a is, e.g., below 22 nm including 22 nm. The average film thickness t is computed by dividing the sectional area of the $CoSi_2$ film 42a by the gate length $L_g$.

On the source/drain diffused layers 40, $CoSi_2$ films 42b, i.e., silicide films 42b of $CoSi_2$ alone are formed.

Thus, a MOS transistor including the gate electrode 30 and the source/drain diffused layers 40 is formed on the silicon substrate 24.

On the silicon substrate 24 with the MOS transistor formed on, a silicon nitride film 44 is formed. On the silicon nitride film 44, a silicon oxide film 46 is formed.

In the silicon oxide film 46 and the silicon nitride film 44, a contact hole 48a is formed down to the $CoSi_2$ film 42a on the gate electrode 30. Contact holes 48b are formed in the silicon oxide film 46 and the silicon nitride film 44 down to the $CoSi_2$ films 42b on the source/drain diffused layers 40.

Contact plugs 54a, 54b of a barrier metal 50 and a tungsten film 52 are buried respectively in the contact holes 48a, 48b.

On the silicon oxide film 46 with the contact plugs 54a, 54b buried in, an inter-layer insulation film 56 is formed.

Thus, the semiconductor device according to the present embodiment is constituted.

The semiconductor device according to the present embodiment is characterized mainly in that the silicide film 42a of $CoSi_2$ alone is formed on the upper part of the gate electrode 30 of a gate length $L_g$ of below 50 nm including 50 nm.

The silicide film 42a formed on the upper part of the gate electrode 30 does not have the relatively high resistance CoSi phase and the low resistance $CoSi_2$ phase mixed each other but has the low resistance $CoSi_2$ phase alone. Thus, according to the present embodiment, the sheet resistance of the gate electrode 30 can be sufficiently decreased, and the scatter of the sheet resistance can be suppressed without failure.

When the semiconductor device is fabricated with respective conditions for the silicidation optimized, the silicide film of $CoSi_2$ alone can be formed even when the aspect ratio of the section of the CoSi film formed by the first thermal processing is 0.7. In this case, the ratio $t/L_g$ of the average film thickness t to the gate length $L_g$ is about 1.07. The aspect ratio of the elliptical section of the $CoSi_2$ film is below 1.23 including 1.23.

When the aspect ratio of the section of the CoSi film formed by the first thermal processing is below 0.4 including 0.4, the silicide film of $CoSi_2$ alone can be formed without optimizing respective conditions for the silicidation. In this case, the ratio $t/L_g$ of the average film thickness t to the gate length $L_g$ is below 0.55 including 0.55. In this case, the aspect ratio of the elliptical section of the $CoSi_2$ film 42a is below 0.70 including 0.70.

Next, the method for fabricating the semiconductor device according to the present embodiment will be explained with reference to FIGS. 12A-12C to 23A-23B.

First, the surface of the silicon substrate 24 is cleaned with, e.g., ammonia/hydrogen peroxide mixture. The silicon substrate 24 is, e.g., a p type (100) silicon substrate.

Figure 12A:
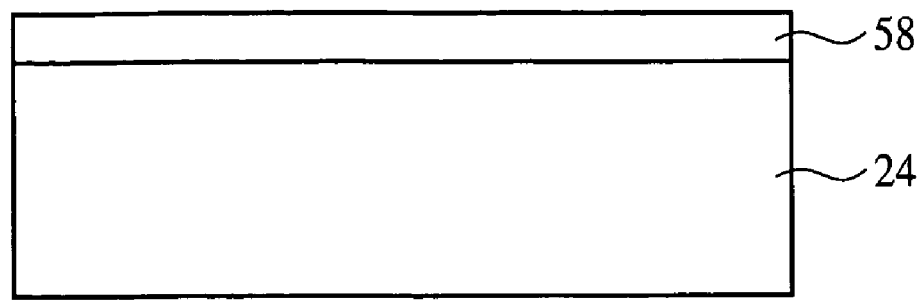
FIGS. 12A-12C, 13A-13C, 14A-14C, 15A-15C, 16A-16C, 17A-17C, 18A-18C, 19A-19C, 20A-20C, 21A-21C, 22A-22C and 23A-23B are sectional views of the semiconductor device according to the embodiment of the present invention in the steps of the method for fabricating the same, which illustrate the method.
Figure 12B:
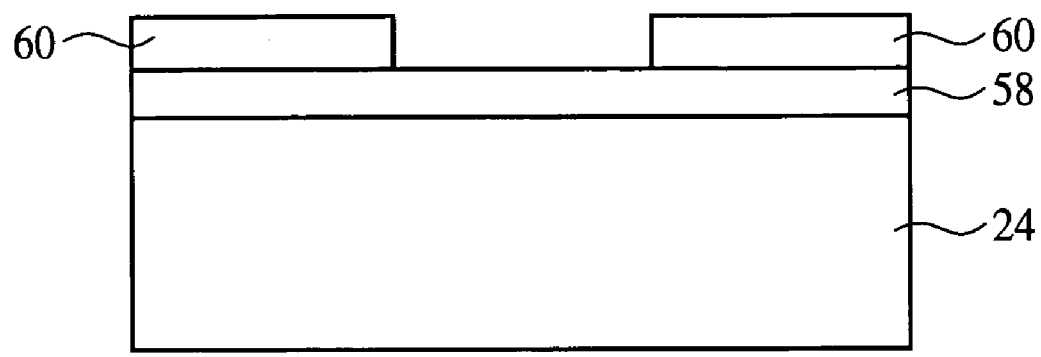

Then, a silicon oxide film 58 of, e.g., a 50 nm-thickness is formed on the silicon substrate 24 by, e.g., thermal oxidation (see FIG. 12A).

Next, a photoresist film 60 is formed by, e.g., spin coating. Then, the photoresist film 60 is patterned by photolithography. Thus, a photoresist mask 60 for patterning the silicon oxide film 58 is formed (see FIG. 12B).

Figure 12C:
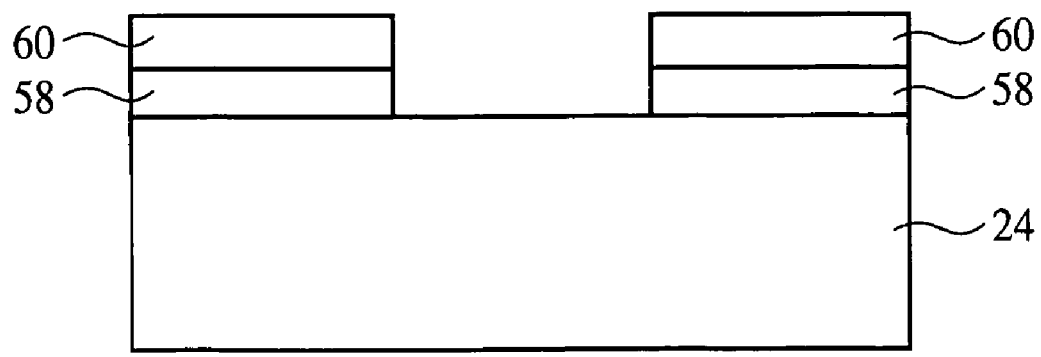

Next, with the photoresist film 60 as the mask, the silicon oxide film 58 is etched (see FIG. 12C).

Next, with the photoresist film 60 and the silicon oxide film 58 as the mask, a dopant impurity is implanted into the silicon substrate 24 by, e.g., ion implantation. Thus, a well 62 of a prescribed conduction type is formed (see FIG. 13A). When a p type well for an NMOS transistor to be formed in is formed, boron, for example, is used as the p type dopant impurity, and conditions for the ion implantation are, e.g., a 120 keV acceleration voltage and a $1 \times 10^{13}$ $cm^{-2}$ dose. When an n type well for a PMOS transistor to be formed in is formed, phosphorus, for example, is used as the n type dopant impurity, and conditions for the ion implantation are, e.g., a 300 keV acceleration voltage and a $1 \times 10^{13}$ $cm^{-2}$ dose.

Figure 13A:
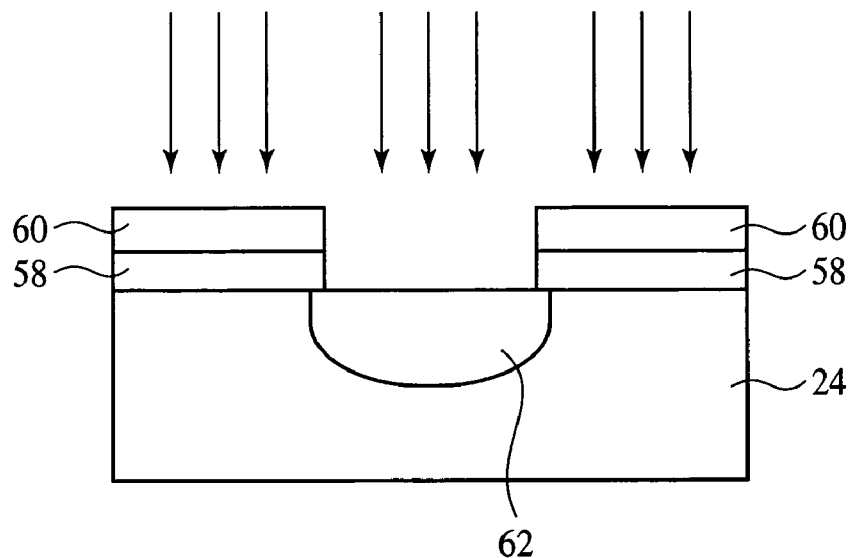
Figure 13B:
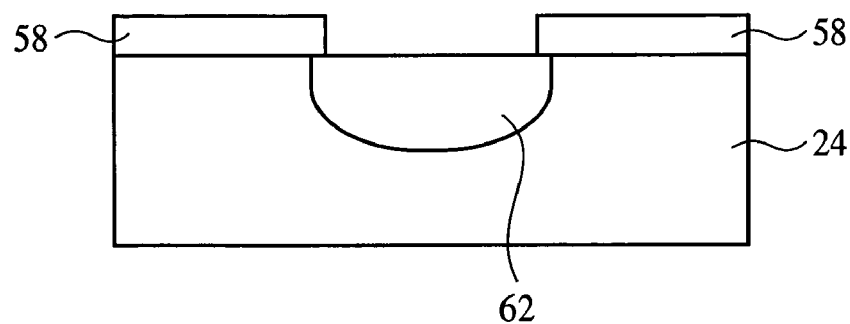
Figure 13C:
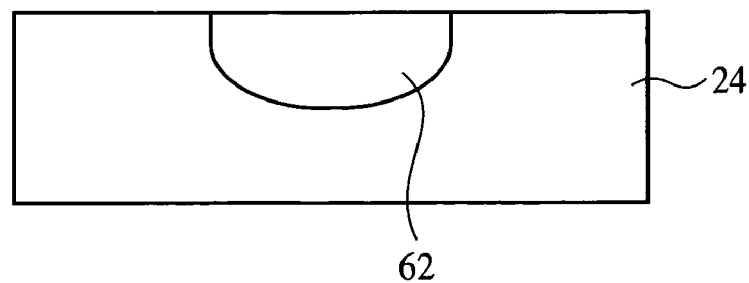

After the well 62 has been formed, the photoresist film 60 is removed (see FIG. 13B). Then, the silicon oxide film 58 is etched off (see FIG. 13C).

Next, the device isolation region for defining the device region is formed by, e.g., STI (Shallow Trench Isolation) as follows.

Figure 14A:
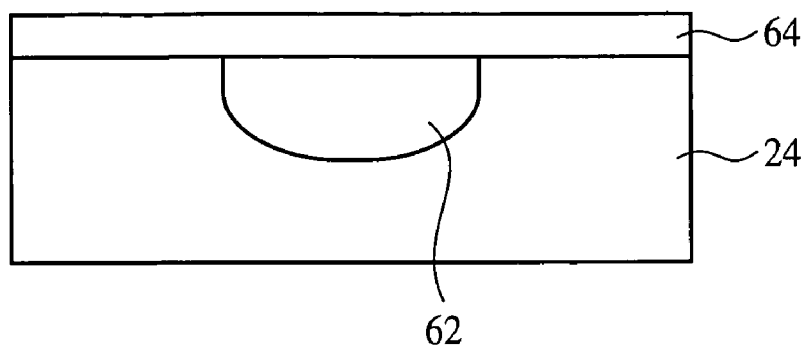
Figure 14B:
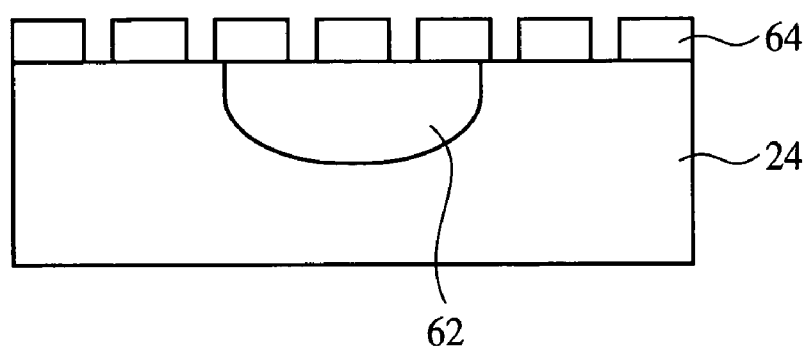
Figure 14C:
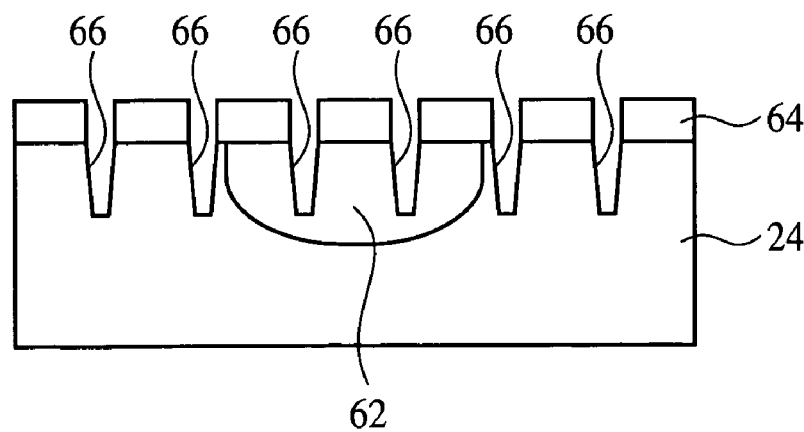

First, a silicon nitride film 64 of, e.g., a 50 nm-thickness is deposited on the silicon substrate 24 by, e.g., CVD (Chemical Vapor Deposition) (see FIG. 14A).

Then, the silicon nitride film 64 is patterned by photolithography and dry etching. Thus, the hard mask 64 for forming trenches for a silicon oxide film to be buried in (see FIG. 14B).

Next, with the silicon nitride film 64 as the mask, the silicon substrate 24 is etched. Thus, the trenches 66 are formed in the silicon substrate 24 (see FIG. 14C).

Figure 15A:
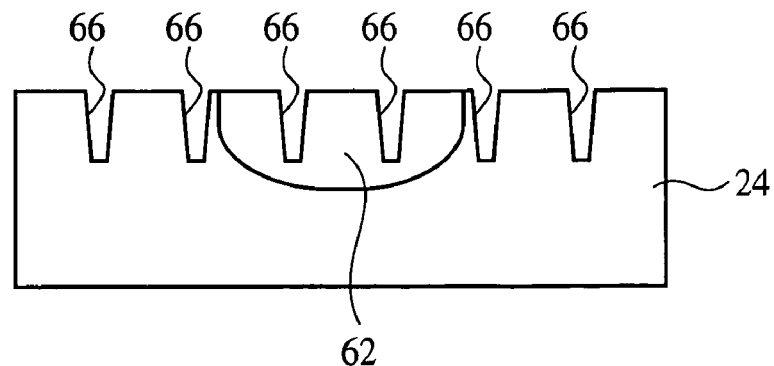

After the trenches 66 have been formed, the silicon nitride film 64, which has been used as the mask, is removed by, e.g., wet etching (see FIG. 15A).

Next, a silicon oxide film of, e.g., a 400 nm-thickness is deposited on the silicon substrate 24 with the trenches 66 formed in.

Next, the silicon oxide film is polished by, e.g., CMP (Chemical Mechanical Polishing) until the surface of the silicon substrate 24 is exposed to thereby remove the silicon oxide film on the silicon substrate 24.

Figure 15B:
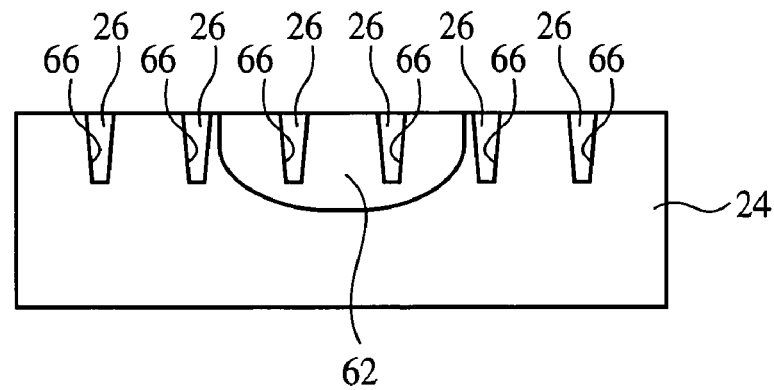

Thus, the device isolation region 26 of the silicon oxide film buried in the trenches 66 are formed (see FIG. 15B). The device isolation region 26 defines device regions.

Figure 15C:
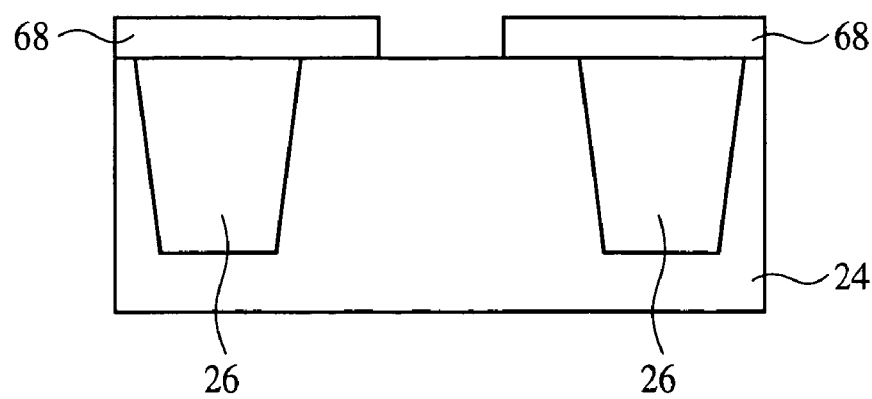

Next, on the silicon substrate 24 with the device isolation region 26 formed in, a photoresist film 68 is formed by, e.g., spin coating. Then, the photoresist film 68 is patterned by photolithography. Thus, a photoresist film 58 for forming a channel doped layer is formed (see FIG. 15C). In FIG. 15C and the followers, the device region for a MOS transistor to be formed in is enlarged.

Next, with the photoresist film 68 as the mask, a dopant impurity is implanted into the silicon substrate 24 by, e.g., ion implantation. Thus, the channel doped layer 32 is formed in the silicon substrate 24 (see FIG. 16A). When an NMOS transistor is formed, boron, for example, is used as the p type dopant impurity, and conditions for the ion implantation are, e.g., a 15 keV acceleration voltage and a $1 \times 10^{13}$ $cm^{-2}$ dose. When a PMOS transistor is formed, arsenic, for example, is used as the n type dopant impurity, and conditions for the ion implantation are, e.g., a 80 keV acceleration voltage and a $1 \times 10^{13}$ $cm^{-2}$ dose.

After the channel doped layer 32 has been formed, the photoresist film 68, which has been used as the mask, is removed.

Next, the dopant impurity in the channel doped layer 32 is activated by thermal processing of, e.g., 950° C. and 10 seconds.

Figure 16A:
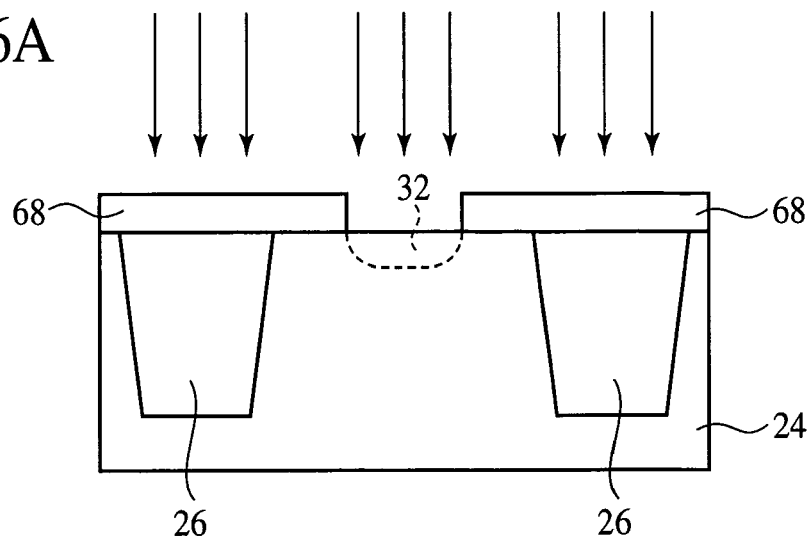
Figure 16B:
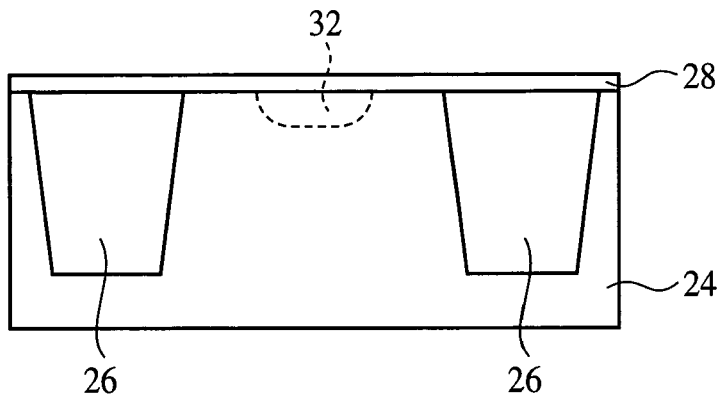

Then, the gate insulation film 28 of a silicon oxide film of, e.g., a 2 nm-thickness is formed on the silicon substrate 24 by, e.g., CVD (see FIG. 16B). As the gate insulation film 28, a silicon oxide film may be formed by thermal oxidation. The gate insulation film 28 is formed of silicon oxide film. However, the gate insulation film 28 may not be essentially formed of silicon oxide film and can be suitably any other insulation film.

Next, a polysilicon film 30 of, e.g., a 100 nm-thickness is formed on the entire surface by, e.g., CVD.

Figure 16C:
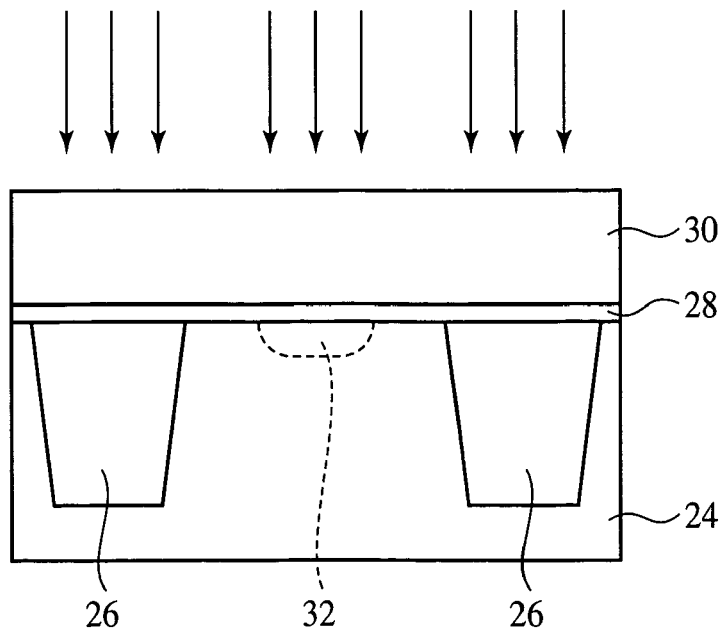
Figure 17A:
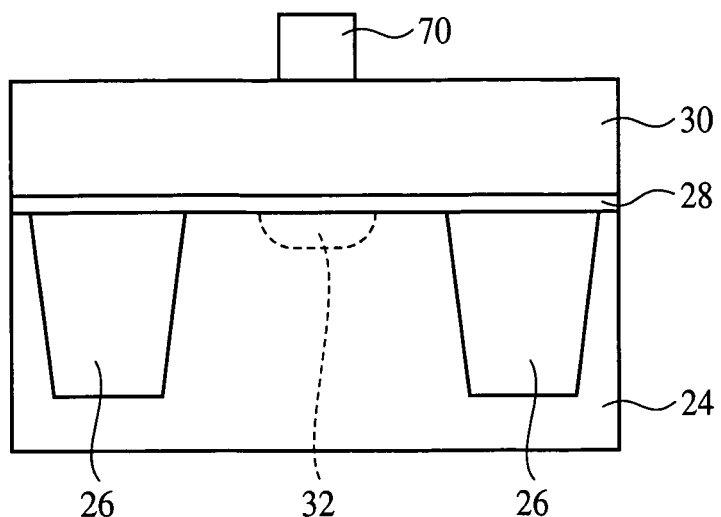
Figure 17B:
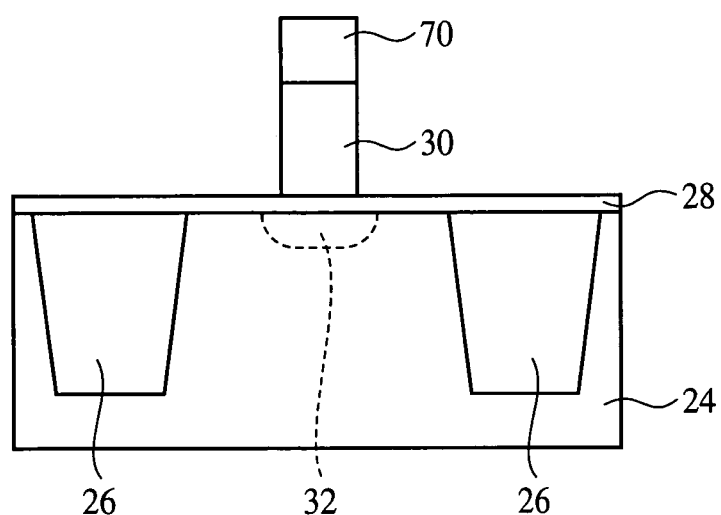
Figure 17C:
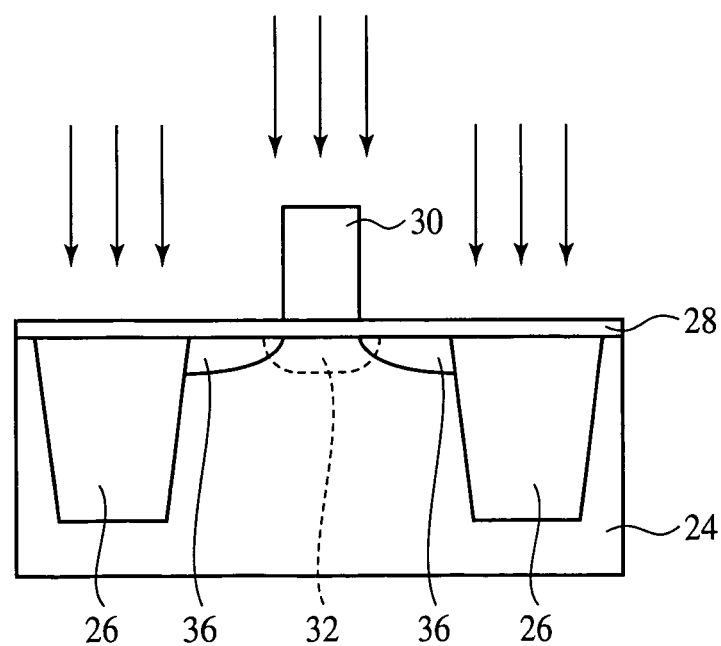

Then, a dopant impurity is implanted into the polysilicon film 30 by, e.g., ion implantation (see FIG. 16C). When an NMOS transistor is formed, phosphorus, for example, is used as the n type dopant impurity, and the conditions for the ion implantation are, e.g., a 10 keV acceleration voltage and a $1 \times 10^{16}$ $cm^{-2}$ dose. When a PMOS transistor is formed, boron, for example, is used as the p type dopant impurity, and conditions for the ion implantation are, e.g., a 5 keV acceleration voltage and a $5 \times 10^{15}$ $cm^{-2}$ dose.

Next, a photoresist film 70 is formed by, e.g., spin coating. Then, the photoresist film 70 is patterned by photolithography. Thus, a photoresist mask 70 for patterning the polysilicon film 30 is formed (see FIG. 17A).

Next, with the photoresist film 70 as the mask, the polysiclion film 30 is dry etched. Thus, the gate electrode 30 of the polysilicon film is formed (see FIG. 17B).

After the gate electrode 30 has been formed, the photoresist film 70 used as the mask is removed.

Then, with the gate electrode 30 as the mask, a dopant impurity is implanted in the silicon substrate 24 on both sides of the gate electrode 30 by, e.g., ion implantation. When an NMOS transistor is formed, arsenic, for example, is used as the n type dopant impurity, and conditions for the ion implantation are, e.g., a 1 keV acceleration voltage and a $1 \times 10^{15}$ $cm^{-2}$ dose. When a PMOS transistor is formed, boron, for example, is used as the p type dopant impurity, and conditions for the ion implantation are, e.g., a 0.5 keV acceleration voltage and a $1 \times 10^{15}$ $cm^{-2}$ dose. Thus, the shallow impurity diffused regions 36 forming the extension regions of the extension source/drain structure (see FIG. 17C).

Figure 18A:
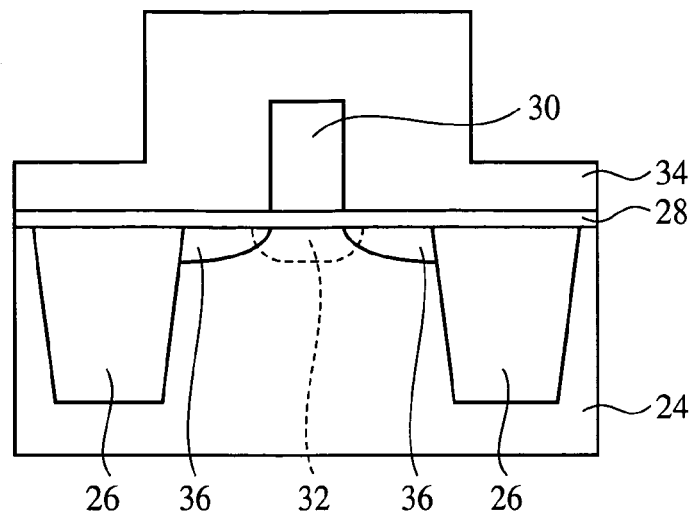
Figure 18B:
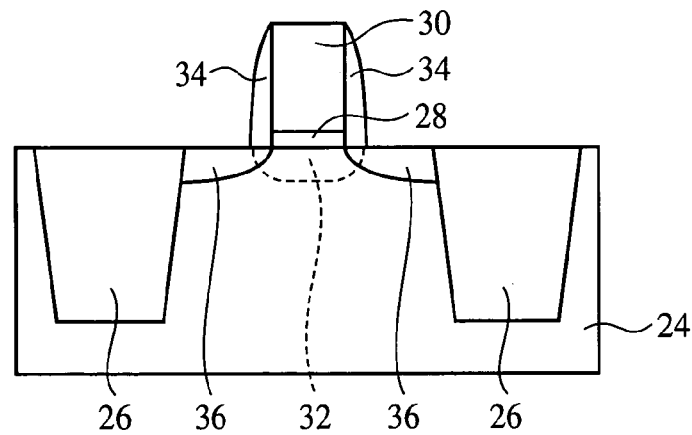
Figure 18C:
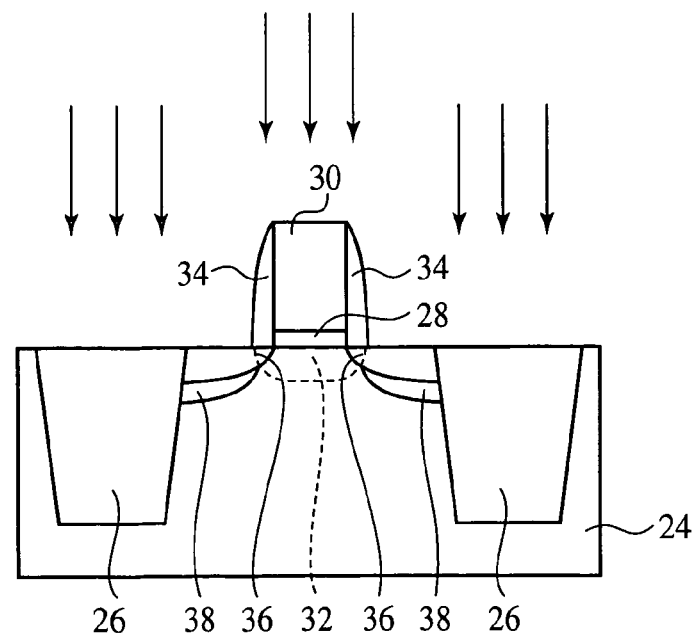

Next, on the entire surface, a silicon oxide film 34 of, e.g., a 100 nm-thickness is formed by, e.g., CVD (see FIG. 18A).

Then, the silicon oxide film 34 is anisotropically etched by, e.g., RIE (Reactive Ion Etching). Thus, the sidewall insulation film 34 of the silicon oxide film is formed on the side walls of the gate electrode 30 (see FIG. 18B). The sidewall insulation film 34 is formed of silicon oxide film. However, the sidewall insulation film 34 is not essentially formed of silicon oxide film and can be suitably any other insulation film.

Then, with the gate electrode 30 and the sidewall insulation film 34 as the mask, a dopant impurity is implanted into the silicon substrate on both sides of the gate electrode 30 and the sidewall insulation film 34. When an NMOS transistor is formed, phosphorus, for example, is used as the n type dopant impurity, and conditions for the ion implantation are, e.g., a 8 keV acceleration voltage and a $1 \times 10^{16}$ cm$^{-2}$ dose. When a PMOS transistor is formed, boron, for example, is used as the p type dopant impurity, and conditions for the ion implantation are, e.g., 5 keV acceleration voltage and a $5 \times 10^{15}$ cm$^{-2}$ dose. Thus, the impurity diffused regions 38 forming the deep regions of the source/drain diffused layer (see FIG. 18C).

Next, prescribed thermal processing is performed to activate the dopant impurities implanted in the impurity diffused regions 36, 38.

Figure 19A:
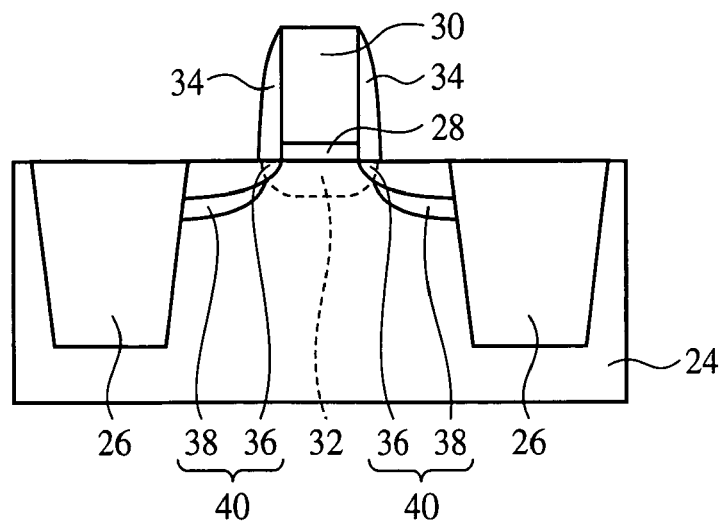

Thus, in the silicon substrate 24 on both sides of the gate electrode 30, the source/drain diffused layers 40 formed of the extension region, i.e., the shallow impurity diffused region 36 and the deep impurity diffused region 38 are formed (see FIG. 19A).

Then, natural oxide film formed on the surface of the gate electrode 30 and the surface of the source/drain diffused layers 40 is removed by, e.g., hydrofluoric acid processing.

Figure 19B:
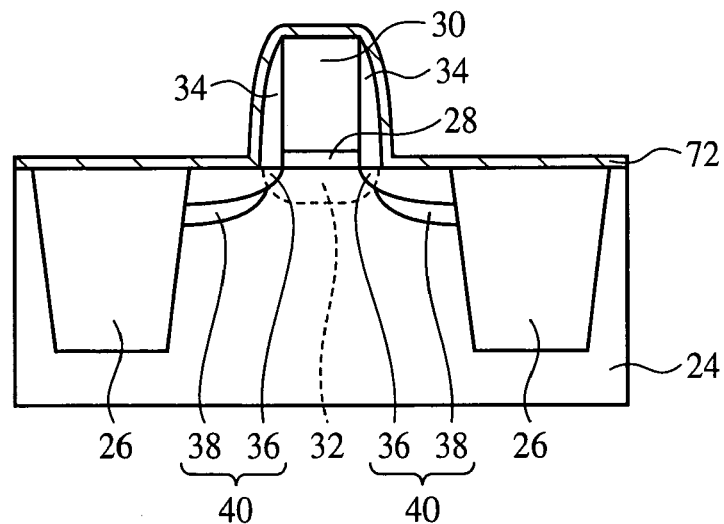

Next, a Co film 72 is deposited on the entire surface by, e.g., sputtering using a Co target (see FIG. 19B). The film thickness of the Co film 72 is set so that the aspect ratio of the elliptical section of the CoSi film 76a formed by the first thermal processing can be below 0.4 including 0.4, in other words, the ratio h/w of the height of the CoSi film 76a to the width w of the CoSi film 76a can be below 0.4 including 0.4. To form such CoSi film 76a, the Co film 72 is formed in, e.g., a 2-6 nm-thickness. For example, for the gate electrode 30 of a 40 nm-gate length $L_g$, the film thickness of the Co film 72 is set at 4 nm.

When the respective conditions for the silicidation is optimized, the film thickness of the Co film 72 can be set so that the aspect ratio of the elliptical section of the CoSi film 76a is below 0.7 including 0.7, in other words the ratio h/w of the height of the CoSi film 76a to the width w of the CoSi film 76a can be below 0.7 including 0.7. To form such CoSi film 76a, the Co film 72 is formed in, e.g., a 2-10 nm-thickness.

Figure 19C:
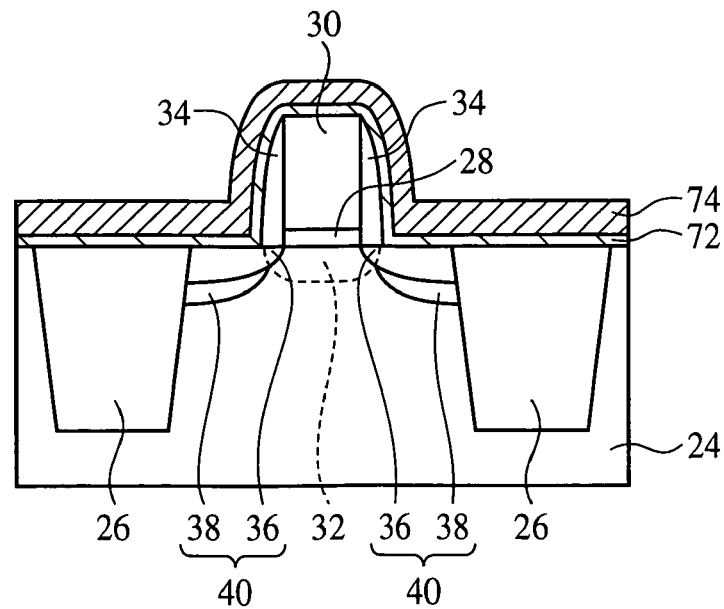

Then, a protection film 74 of a titanium nitride (TiN) film of, e.g., a 30 nm-thickness is formed on the Co film 72 by, e.g., sputtering (see FIG. 19C). Conditions for forming the TiN film 74 are, e.g., a 9 kW sputtering power, an N$_2$/Ar ratio of the sputtering atmosphere of 100/50 (in sccm) and a 0 V substrate bias. The protection film 74 can prevent the oxidation of the Co film 72, and the CoSi film to be formed later.

When the TiN film as the protection film 74 is formed in a small thickness of below 2 nm including 2 nm, the TiN film has the nanograin structure or amorphous. Accordingly, the Ti of the TiN film might be diffused into the Co film 72. Such thin TiN film can not perfectly shut off the diffusion of the residual oxygen in the atmosphere into the Co film 72, and a trace of the oxygen might intruded into the Co film 72. When the Ti and the oxygen thus intrude into the Co film 72, even traces of such impurities, which do not influence the silicidation reaction, are effective to pin the migration of the Co atoms in the Co film 72 and can suppress the supply of the Co atoms to the upper part of the gate electrode 30 being silicided. Thus, the TiN film as the protection film 74 is formed in a film thickness of below 20 nm including 20 nm, whereby when there is a risk that because of a small gate length $L_g$ of the gate electrode 30, a total amount of the Si atoms for forming the low resistance CoSi$_2$ film might be insufficient, the supply of the Co can be suppressed. Resultantly, the formation of the relatively high resistance CoSi phase on the upper part of the gate electrode 30 can be suppressed, and the scatter of the sheet resistance of the gate electrode 30 can be more surely suppressed.

Then, as the first thermal processing for the silicidation, thermal processing of, e.g., 480° C. and 30 seconds is performed by, e.g., RTA, whereby the Co film 72 and the Si in the upper part of the gate electrode 30 are reacted with each other, and the Co film 72 and the Si in the upper part of the source/drain diffused layer 40 are reacted with each other. Thus, a CoSi film 76a, i.e., a silicide film 76a of the CoSi phase is formed on the upper part of the gate electrode 30, and on the source/drain diffused layers 40, the silicide films 76b, i.e., the silicide films 76b of the CoSi phase are formed (see FIG. 20A). At this time, substantially all the Co film 72 on the gate electrode 30 and the source/drain diffused layers 40 has reacted, and substantially none of the Co film 72 remains unreacted.

The sectional shape of the CoSi film 76a formed here on the upper part of the gate electrode 30 is elliptical, and the aspect ratio of the ellipse is below 0.4 including 0.4. For example, when the Co film 74 is formed in a 4 nm-thickness for the gate electrode 30 of a 40 nm gate length $L_g$, the aspect ratio of the elliptical section of the CoSi film 76a is 0.37.

When respective conditions for the silicidation are optimized, the aspect ratio of the elliptical section of the CoSi film 78a may be below 0.7 including 0.7.

Figure 20A:
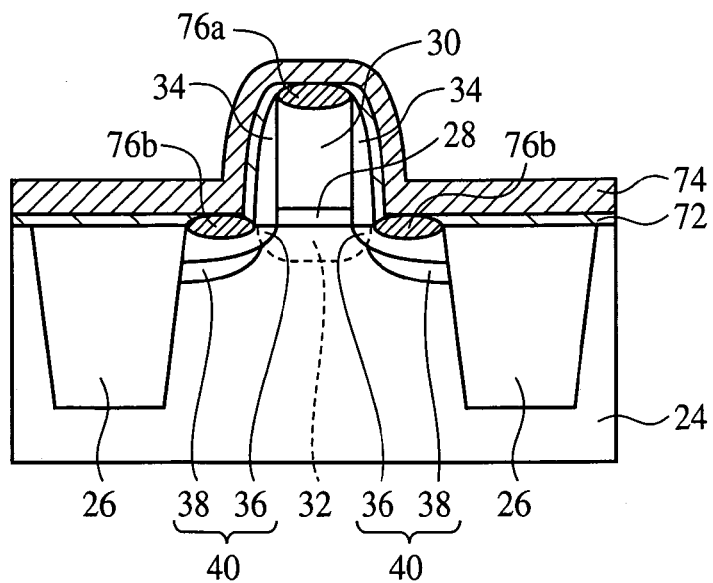
Figure 20B:
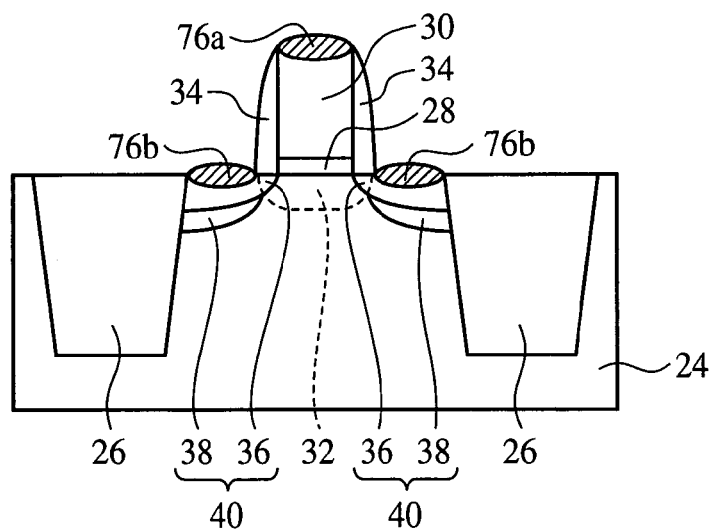
Figure 20C:
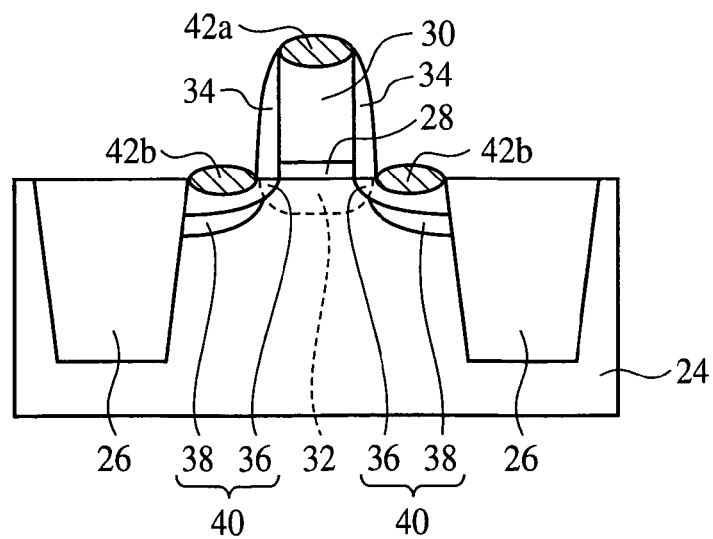

Then, the parts of the Co film 72 formed on the protection film 74, and the insulation films such as the sidewall insulation film 34 and the device isolation region 26, etc., which have not reacted with the Si, are selectively removed by wet etching (see FIG. 20B). The etchant is, e.g., sulfuric acid/hydrogen peroxide mixture mixing sulfuric acid and hydrogen peroxide in a ratio of 3:1. The etching period of time is, e.g., 20 minutes.

Next, as the second thermal processing for the silicidation, thermal processing of, e.g., 750° C. and 30 seconds is performed by, e.g., RTA, whereby the CoSi film 76a and the Si in the upper part of the gate electrode 30 are reacted with each other, and the CoSi films 76b and the Si in the upper parts of the source/drain diffused layers 40 are reacted with each other. The CoSi films 76a, 76b are thus phase transformed, and a CoSi$_2$ film 42a is formed on the upper part of the gate electrode 30, and the CoSi$_2$ films 42b are formed on the source/drain diffused layers 40 (see FIG. 20C).

The unstability in energy of the CoSi film 76a before the second thermal processing, i.e., the aspect ratio of the elliptical section of the CoSi film 76a of below 0.4 including 0.4 surely advances the phase transformation from the CoSi film 76a to the CoSi$_2$ film 42a by the second thermal processing, and the silicide film 42a of the low resistance CoSi$_2$ phase alone can be surely formed on the upper part of the gate electrode 30. Thus, the sheet resistance of the gate electrode 30 silicided by using the Co film 72 can be sufficiently decreased, and the scatter of the sheet resistance can be surely suppressed.

The CoSi$_2$ film 42a formed in the case of the aspect ratio of the elliptical section of the CoSi film 76a being below 0.4 including 0.4 has a ratio t/$L_g$ of the average film thickness t to the gate length $L_g$ of below 0.55 including 0.55. The sectional shape of the $CoSi_2$ film 42a is elliptical, and the aspect ratio of the ellipse is below 0.70 including 0.70.

When respective conditions for the silicidation are optimized, with the aspect ratio of the elliptical section of the CoSi film 76a being below 0.7 including 0.7, the phase transformation from the CoSi film 76a to the $CoSi_2$ film 42a surely advances in the second thermal processing, and the silicide film 42a of the low resistance $CoSi_2$ alone can be formed on the upper part of the gate electrode 30.

As described above, respective conditions for the silicidation are optimized, whereby even when the aspect ratio of the elliptical section of the silicide film of the CoSi phase is 0.7 which is somewhat large, the phase transformation from the silicide film of the CoSi phase to the silicide film of the $CoSi_2$ phase can be ensured. Conditions for ensuring the phase transformation from the silicide film of the CoSi phase to the silicide film of the $CoSi_2$ phase even when the aspect ratio of the elliptical section of the silicide film of the CoSi film is 0.7 which is somewhat large are as exemplified below. As the pre-processing before the deposition of the Co film 72, the processing with diluted hydrofluoric acid is performed. The Co film 72 is deposited at a 350° C. deposition temperature and in a 5 nm-thickness. As the protection film 74 to be formed on the Co film 72, a TiN film of a 5 nm-thickness is deposited. For the first thermal processing, the temperature of the thermal processing is 500° C., and the thermal processing period of time is 30 seconds. The part of the Co film 72 which has not reacted is selectively etched off by sulfuric acid/hydrogen peroxide mixture mixing sulfuric acid and hydrogen peroxide. In the second thermal processing, the thermal processing temperature is 700° C., and the thermal processing period of time is 30 seconds. The silicidation under these conditions can surely suppress the scatter of the sheet resistance of the gate electrode 30 even when the gate length $L_g$ is 30 nm, which is relatively small.

The $CoSi_2$ film 42a formed when the aspect ratio of the elliptical section of the CoSi film 76a is below 0.7 including 0.7 has a ratio $t/L_g$ of the average film thickness t to the gate length $L_g$ of below 1.07 including 1.07. The sectional shape of the $CoSi_2$ film 42a is elliptical, and the aspect ratio of the ellipse is below 1.23 including 1.23.

Then, a silicon nitride film 44 of, e.g., a 50 nm-thickness is formed on the entire surface by, e.g., plasma CVD. The film forming temperature of the silicon nitride film 44 is, e.g., 500° C.

Figure 21A:
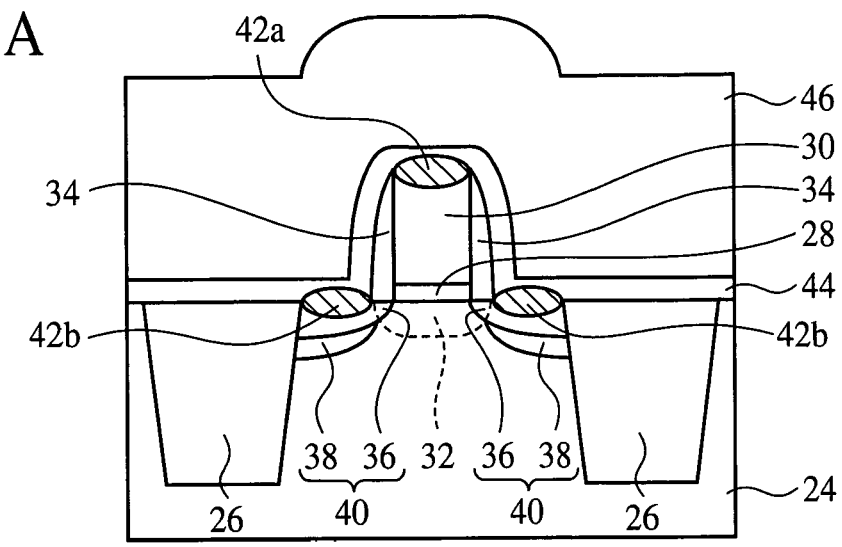

Then, a silicon oxide film 46 of, e.g., a 600 nm-thickness is formed on the silicon nitride film 44 by, e.g., plasma CVD (see FIG. 21A). The film forming temperature of the silicon oxide film 46 is, e.g., 400° C.

Figure 21B:
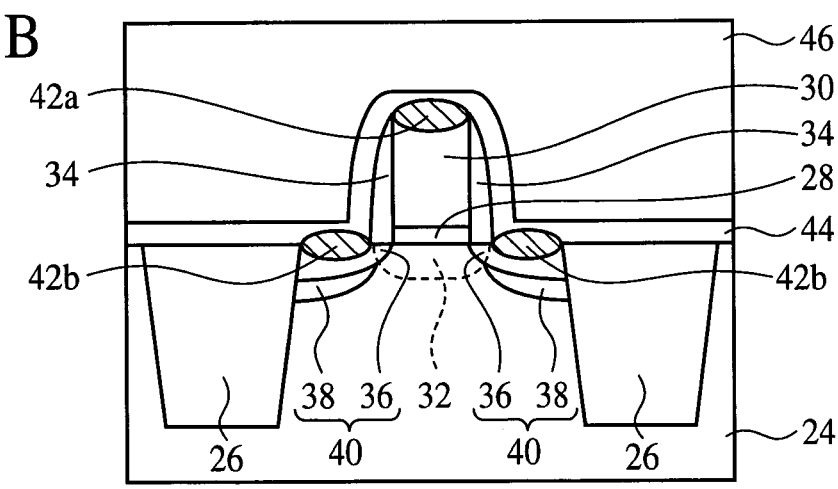

Next, the silicon oxide film 46 is planarized by, e.g., CMP (see FIG. 21B).

Figure 21C:
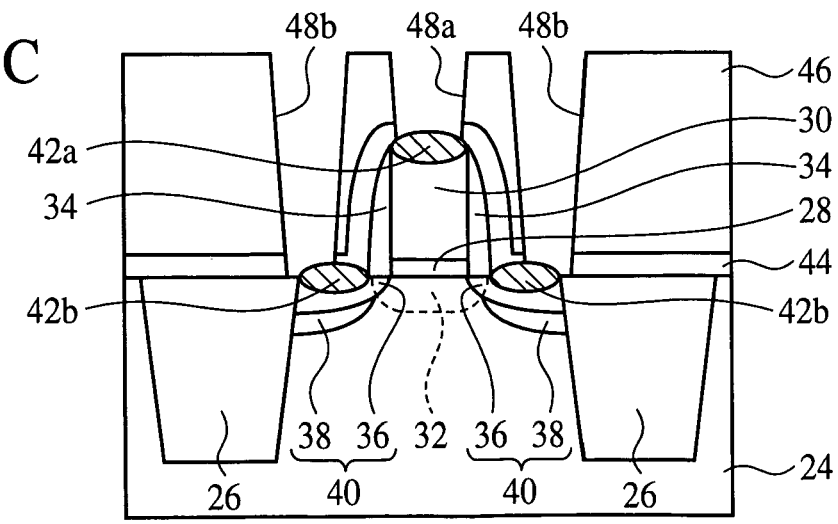

Then, by photolithography and dry etching, a contact hole 48a and contact holes 48b are formed in the silicon oxide film 46 and the silicon nitride film 44 respectively down to the $CoSi_2$ film 42a and down to the $CoSi_2$ films 42b (see FIG. 21C)

Then, a barrier metal 50 of a titanium nitride film of, e.g., a 50 nm-thickness is formed by sputtering on the silicon oxide film 46 with the contact holes 48a, 48b formed in.

Figure 22A:
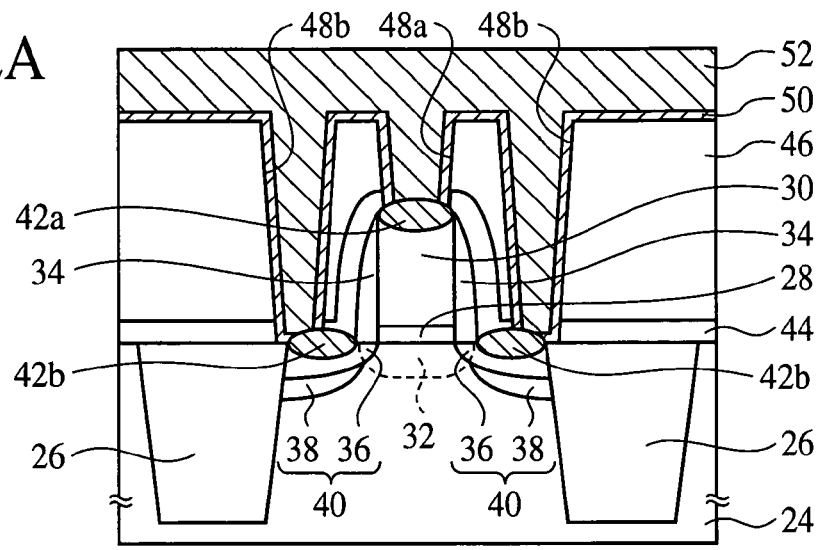
Figure 22B:
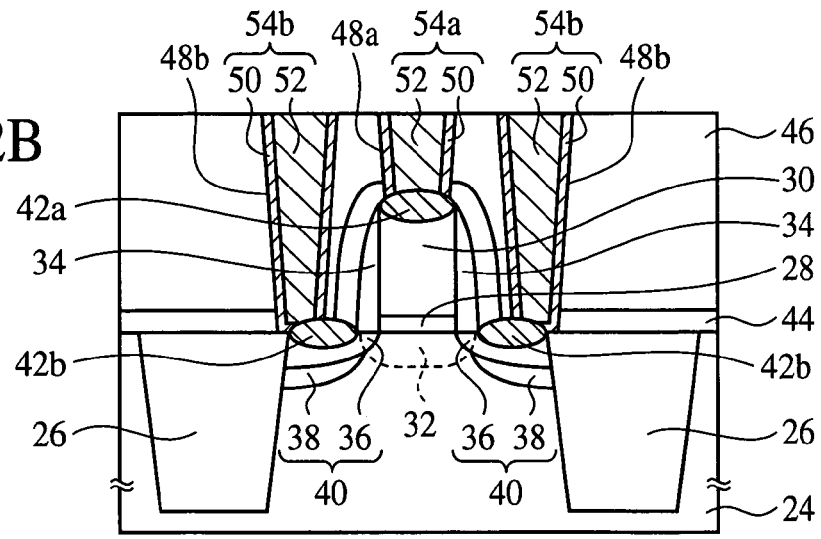

Next, on the barrier metal 50, a tungsten film 52 of, e.g., a 300 nm-thickness is formed by, e.g., CVD (see FIG. 22A).

Then, the tungsten film 52 and the barrier metal 50 are polished by, e.g., CMP until the surface of the silicon oxide film 46 is exposed. Thus, contact plugs 54a, 54b of the barrier metal 50 and the tungsten film 52 are formed respectively in the contact holes 48a, 48b (see FIG. 22B).

Figure 22C:
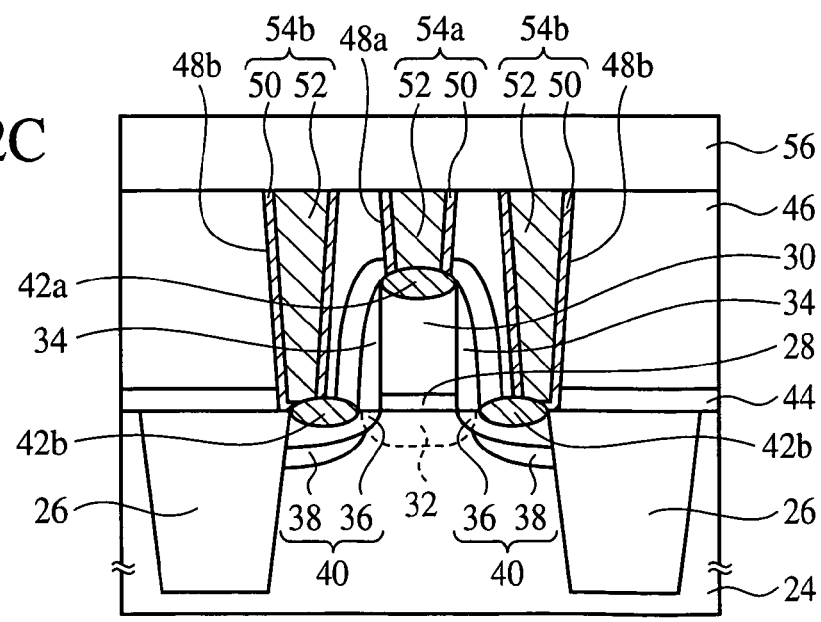

Next, an inter-layer insulation film 56 is formed on the entire surface (see FIG. 22C).

Then, the inter-layer insulation film 56 is polished by, e.g., CMP to be planarized, and then trenches 78 are formed in the inter-layer insulation film 56 by photolithography and dry etching.

Next, a layer film 80 of a Ta film and a Cu film is deposited in, e.g., a 20 nm-thickness on the entire surface by, e.g., sputtering.

Next, with the Cu film of the layer film 80 as the seed, a Cu film 82 of, e.g., a 500 nm-thickness is deposited by plating.

Then, the Cu film 82 and the layer film 80 are polished by, e.g., CMP until the inter-layer insulation film 56 is exposed to thereby remove the Cu film 82 and the layer film 80 on the inter-layer insulation film 56. Thus, interconnection layers 84 of the Cu film 82 electrically connected to the contact plugs 54a, 54b are formed in the trenches 78 (see FIG. 23A).

Then, an inter-layer insulation film 86 is formed on the entire surface.

Contact holes 88 are formed in the inter-layer insulation film 86 down to the interconnection layers 84 by photolithography and dry etching.

Next, a layer film of a Ta film and a Cu film in, e.g., a 20 nm-thickness on the entire surface by, e.g., sputtering.

Next, with the Cu film of the layer film 90 as the seed, a Cu film 92 of, e.g., a 300 nm-thickness is deposited by plating.

Then, the Cu film 92 and the layer film 90 are polished by, e.g., CMP until the inter-layer insulation film 86 is exposed to thereby remove the Cu film 92 and the layer film 90 on the inter-layer insulation film 86. Thus, conductor plugs 94 electrically connected to the interconnection layer 84 are formed in the contact holes 88.

Next, a TiN film 96 of, e.g., a 50 nm-thickness, an Al film 98 of, e.g., a 500 nm-thickness and a TiN film 100 of, e.g., a 50 nm-thickness are sequentially deposited on the entire surface by, e.g., sputtering.

Figure 23A:
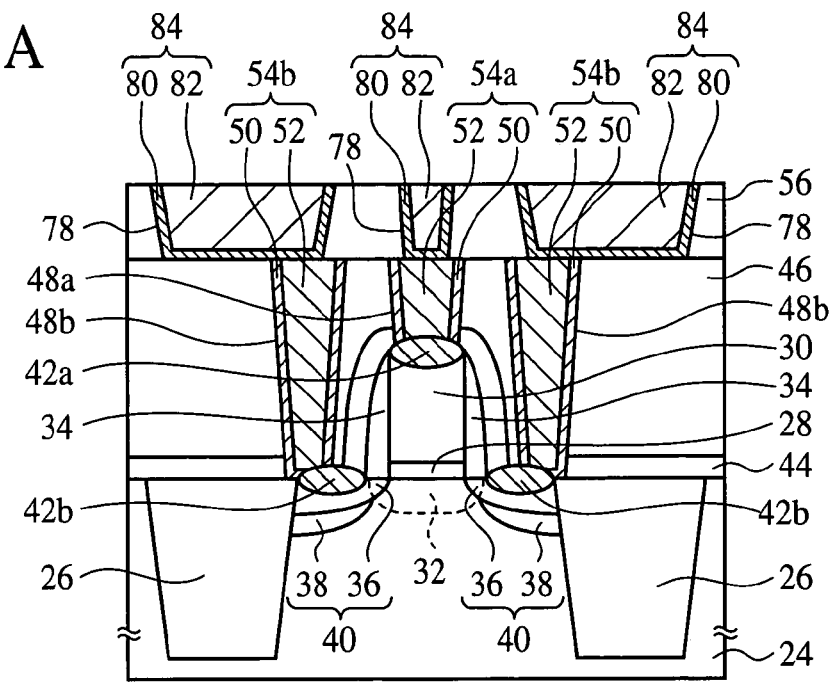
Figure 23B:
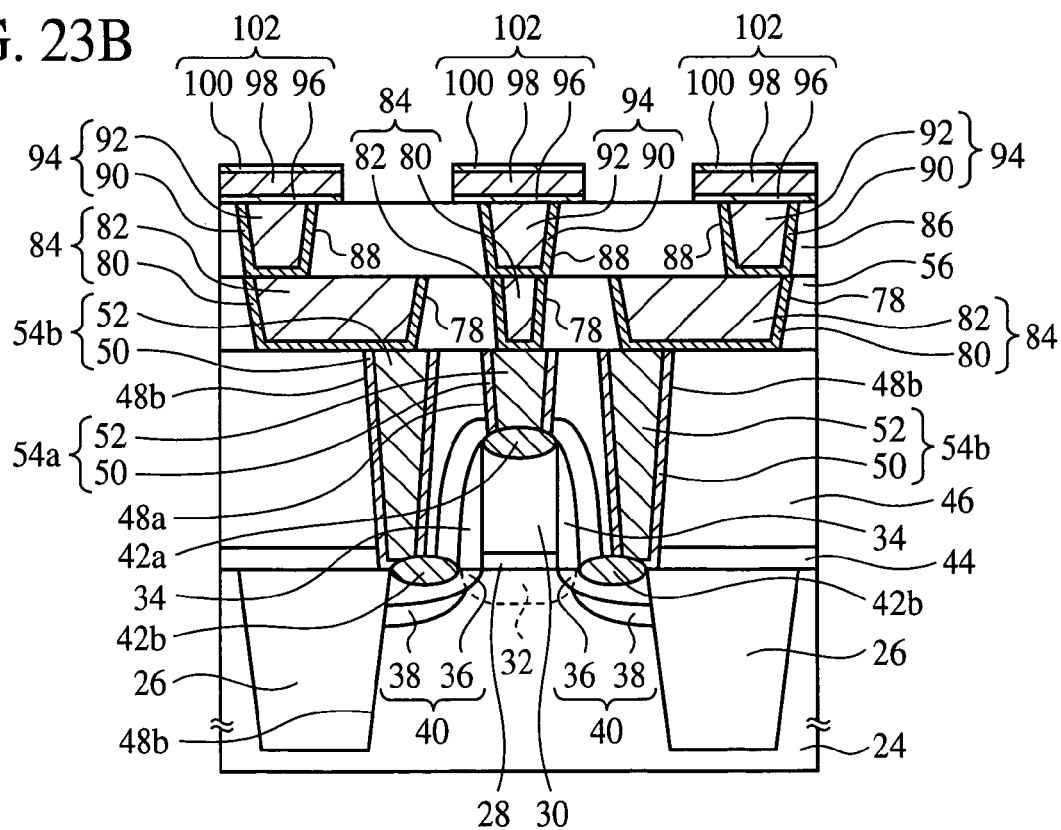
Figure 24:
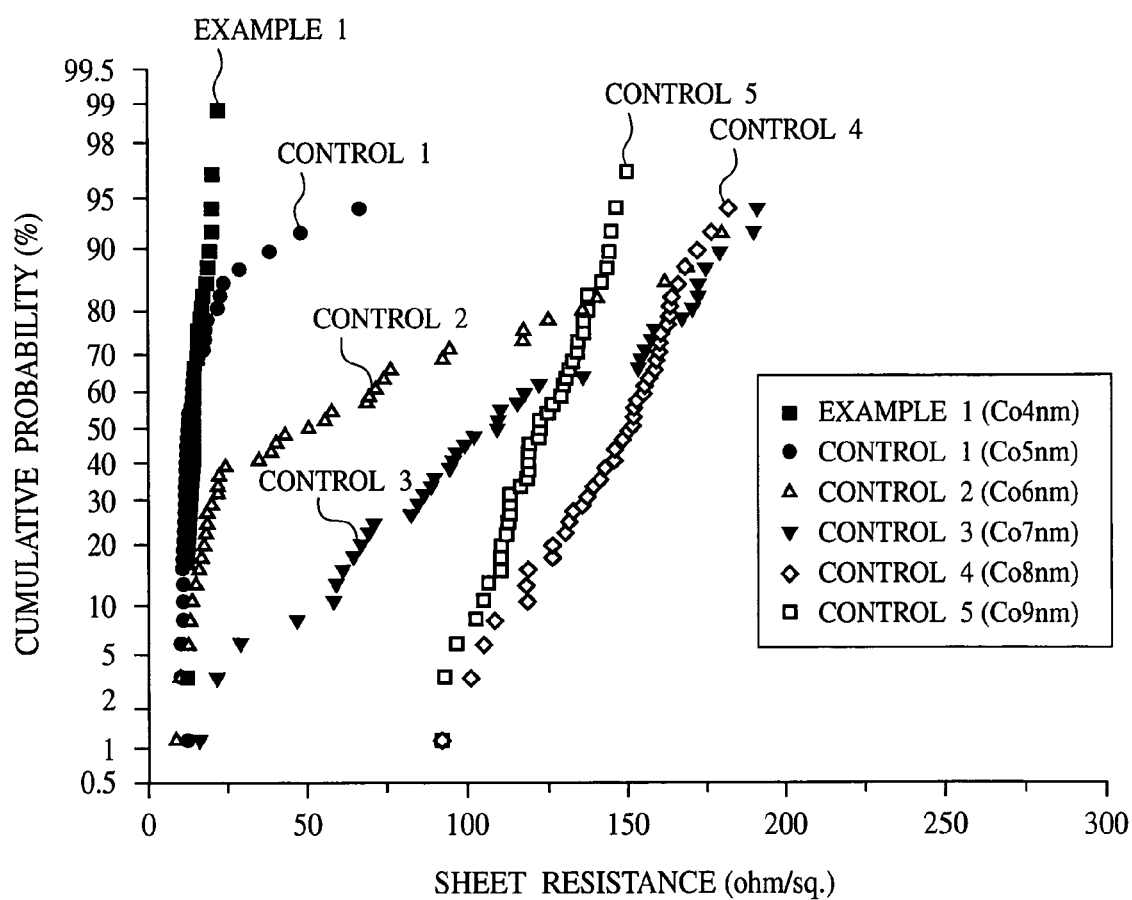
FIG. 24 is a graph of the result of evaluating the method for fabricating the semiconductor device according to the embodiment of the present invention.

Then, the TiN film 96, the Al film 98 and the TiN film 100 are patterned by photolithography and dry etching to thereby form electrodes 102 electrically connected to the conductor plugs 94 (see FIG. 23B).

Thus, the semiconductor device according to the present embodiment is fabricated.

(Evaluation Result)

Next, the result of evaluating the method for fabricating the semiconductor device according to the present embodiment will be explained with reference to FIG. 24.

The sheet resistance was measured on the gate electrode of an NMOS transistor fabricated by the method for fabricating the semiconductor device according to the present embodiment. The gate length $L_g$ was 40 nm. The sheet resistance was measured on a plurality of samples, and the cumulative probabilities were plotted. FIG. 24 shows the measured results. The sheet resistance of the gate electrode is taken on the horizontal axis, and the cumulative probability is taken on the vertical axis.

In FIG. 24, the ■-marked plots indicate the measured result of Example 1, i.e., the result measured on the semiconductor device fabricated by the method for fabricating the semiconductor device according to the present embodiment. In Example 1, the film thickness of the Co film was 4 nm; the aspect ratio of the elliptical section of the CoSi film formed by the first thermal processing was 0.37; and the ratio $t/L_g$ of the average film thickness t of the $CoSi_2$ film formed by the second thermal processing to the gate length $L_g$ was 0.5. The aspect ratio of the elliptical section of the CoSi$_2$ film at this time was 0.65.

In FIG. 24, the ●-marked plots indicate the measured result of Control 1 in which the film thickness of the Co film was 5 nm; the △-marked plots indicate the measured result of Control 2 in which the film thickness of the Co film was 6 nm; the ▼-marked plots indicate the measured result of Control 3 in which the film thickness of the Co film was 7 nm; the ◇-marked plots indicate the measured result of Control 4 in which the film thickness of the Co film was 8 nm; and the □-marked plots indicate the measured result of Control 5 in which the film thickness of the Co film was 9 nm. In Controls 1 to 3, the aspect ratio of the elliptical section of the CoSi film formed by the first thermal processing was respectively 0.47, 0.60 and 0.73.

As evident in the comparison among the respective plots shown in FIG. 24, in Example 1, the film thickness of the Co film was set so small as 4 nm, and the aspect ratio was 0.37, which is extremely small, whereby the phase transformation from the CoSi film to the CoSi$_2$ film can be ensured. Accordingly in Example 1, the sheet resistance of the gate electrode is smaller and the scatter of the sheet resistance is conspicuously suppressed, in comparison with Controls 1 to 5. In contrast to this, in Controls 1 to 5, the film thickness of the Co film is not set sufficiently small, and the aspect ratio of the section of the CoSi film formed by the first thermal processing is relatively large, whereby the phase transformation from the CoSi film to the CoSi$_2$ film is suppressed. Accordingly, in Controls 1 to 5, the sheet resistance of the gate electrode is large and the scatter of the sheet resistance is large, in comparison with Example 1.

As described above, according to the present embodiment, the CoSi film 76a is formed so that the ratio h/w of the height h to the width w can be below 0.7 including 0.7, more preferably below 0.4 including 0.4 by the first thermal processing, whereby the relatively high resistance CoSi film 76a can be surely phase transformed to the low resistance CoSi$_2$ film 42a by the second thermal processing. Thus, according to the present embodiment, even when the fine gate electrode 30 is silicided by using the Co film 72, the sheet resistance of the gate electrode 30 can be sufficiently decreased, and the scatter of the sheet resistance can be surely suppressed.

MODIFIED EMBODIMENTS

The present invention is not limited to the above-described embodiment and can cover other various modifications.

For example, in the above-described embodiment, the sectional shape of the CoSi film 76a and the CoSi$_2$ film 42a is elliptical. The sectional shape of the CoSi film 76a and the CoSi$_2$ film 42a is not essentially a perfect ellipse. The sectional shape of the CoSi film 76a and the CoSi$_2$ film 42a includes shapes approximate to ellipse, and in this case, the aspect ratios of the approximate ellipses of the CoSi film 76a and the CoSi$_2$ film 42a may be set at below the value set above including the value set above.

In the above-described embodiment, the first thermal processing and the second thermal processing are performed by RTA. However, the first thermal processing and the second thermal processing are not essentially performed by RTA and can be performed by furnace anneal, spike anneal or others. The thermal processing by RTA, furnace anneal and spike anneal may be suitably combined.

The conditions for the first thermal processing are not limited to those of the above-described embodiment. In the first thermal processing, the thermal processing temperature can be, e.g., 400-600° C. The thermal processing time can be, e.g., 10 seconds-60 minutes.

The conditions for the second thermal processing are not limited to those of the above-described embodiment. The thermal processing temperature for the second thermal processing can be substantially the same as that of the first thermal processing or higher than the thermal processing temperature of the first thermal processing, specifically can be, e.g., 600-800° C. The thermal processing time can be, e.g., 10-120 seconds. Otherwise, for example, as the second thermal processing, the spike anneal of the thermal processing temperature of 800-950° C. and the thermal processing time of below 1 second excluding 1 second may be performed.

In the above-described embodiment, the Co film 72 is formed by sputtering but is not formed essentially by sputtering. The Co film 72 may be formed vapor deposition such as e.g., electron beam deposition or others, other than sputtering.

In the above-described embodiment, substantially all the Co film 72 on the gate electrode 30 and the source/drain diffused layers 40 is reacted by the first thermal processing. However, the film thickness of the Co film 72, thermal processing conditions, etc. may be suitably set so that the Co film 72 is partially reacted.

In the above-described embodiment, the protection film 74 is formed on the Co film 72, but the protection film 74 may not be formed. However, when the substrate with the Co film formed on, with the Co film exposed, is mounted on a substrate carrier cassette or loaded in the furnace of an RTA system or the chamber of the film forming system, Co particles often adhere to other substrates, etc. which will be mounted on the cassette or loaded in the furnace of the RTA system or the chamber of the film forming system. The protection film 74 is formed on the Co film 72, whereby the secondary contamination with the Co can be prevented.

What is claimed is:

1. A method for fabricating a semiconductor device comprising:
   the step of forming a gate electrode having a gate length of below 50 nm including 50 nm over a semiconductor substrate;
   the step of forming a source/drain diffused layer in the semiconductor substrate on both sides of the gate electrode;
   the step of forming a cobalt film on the gate electrode;
   the first thermal processing step of reacting the cobalt film with the gate electrode to form a cobalt monosilicide film on an upper part of the gate electrode;
   the step of selectively etching off a part of the cobalt film, which has not reacted; and
   the second thermal processing step of reacting the cobalt monosilcide film with the gate electrode to form a cobalt disilicide film on the upper part of the gate electrode, wherein
   in the first thermal processing step, the cobalt monosilicide film is formed so that a ratio h/w of a height of the cobalt monosilicide film to a width of the cobalt monosilicide film is below 0.7 including 0.7.

2. A method for fabricating a semiconductor device according to claim 1, wherein
   in the first thermal processing step, the cobalt monosilicide film is formed so that the ratio h/w is below 0.4 including 0.4.

3. A method for fabricating a semiconductor device according to claim 2, wherein a sectional shape of the cobalt monosilicide film is an ellipse.

4. A method for fabricating a semiconductor device according to claim 2, wherein
a thermal processing temperature of the second thermal processing step is higher than that of the first thermal processing step.

5. A method for fabricating a semiconductor device according to claim 4, wherein
the thermal processing temperature of the second thermal processing step is 600-850° C., and a thermal processing period of time of the second thermal processing step is 1-60 seconds.

6. A method for fabricating a semiconductor device according to claim 4, wherein
the thermal processing temperature of the second thermal processing step is 800-950° C., and a thermal processing period of time of the second thermal processing step is below 1 second excluding 1 second.

7. A method for fabricating a semiconductor device according to claim 2, further comprising after the step of forming the cobalt film and before the first thermal processing step, the step of
forming on the cobalt film a protection film for preventing the oxidation of the cobalt film.

8. A method for fabricating a semiconductor device according to claim 7, wherein
in the step of forming the protection film, the protection film is formed of a titanium nitride film.

9. A method for fabricating a semiconductor device according to claim 8, wherein
a film thickness of the titanium nitride film is below 20 nm including 20 nm.

10. A method for fabricating a semiconductor device according to claim 1, wherein
a sectional shape of the cobalt monosilicide film is an ellipse.

11. A method for fabricating a semiconductor device according to claim 10, wherein
a thermal processing temperature of the second thermal processing step is higher than that of the first thermal processing step.

12. A method for fabricating a semiconductor device according to claim 10, further comprising after the step of forming the cobalt film and before the first thermal processing step, the step of
forming on the cobalt film a protection film for preventing the oxidation of the cobalt film.

13. A method for fabricating a semiconductor device according to claim 1, wherein
a thermal processing temperature of the second thermal processing step is higher than that of the first thermal processing step.

14. A method for fabricating a semiconductor device according to claim 13, wherein
the thermal processing temperature of the second thermal processing step is 600-850° C., and a thermal processing period of time of the second thermal processing step is 1-60 seconds.

15. A method for fabricating a semiconductor device according to claim 13, wherein
the thermal processing temperature of the second thermal processing step is 800-950° C., and a thermal processing period of time of the second thermal processing step is below 1 second excluding 1 second.

16. A method for fabricating a semiconductor device according to claim 1, further comprising after the step of forming the cobalt film and before the first thermal processing step, the step of
forming on the cobalt film a protection film for preventing the oxidation of the cobalt film.

17. A method for fabricating a semiconductor device according to claim 16, wherein
in the step of forming the protection film, the protection film is formed of a titanium nitride film.

18. A method for fabricating a semiconductor device according to claim 17, wherein
a film thickness of the titanium nitride film is below 20 nm including 20 nm.

* * * * *